US008773937B2

(12) United States Patent
Schakel et al.

(10) Patent No.: US 8,773,937 B2
(45) Date of Patent: *Jul. 8, 2014

(54) MEMORY REFRESH APPARATUS AND METHOD

(75) Inventors: Keith R. Schakel, San Jose, CA (US); Suresh Natarajan Rajan, San Jose, CA (US); Michael John Sebastian Smith, Palo Alto, CA (US); David T. Wang, Thousand Oaks, CA (US); Frederick Daniel Weber, San Jose, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/315,933

(22) Filed: Dec. 9, 2011

(65) Prior Publication Data

US 2012/0147684 A1    Jun. 14, 2012

Related U.S. Application Data

(63) Continuation of application No. 11/461,437, filed on Jul. 31, 2006, now Pat. No. 8,077,535, which is a continuation-in-part of application No. 11/474,075, filed on Jun. 23, 2006, now Pat. No. 7,515,453.

(60) Provisional application No. 60/693,631, filed on Jun. 24, 2005.

(51) Int. Cl.
*G11C 7/00* (2006.01)

(52) U.S. Cl.
USPC ............ 365/222; 365/194; 365/233.13

(58) Field of Classification Search
USPC .................... 365/222, 194, 233.13
See application file for complete search history.

(56) References Cited

U.S. PATENT DOCUMENTS

| 3,742,098 | A | 6/1973 | Oswald et al. |
| 3,800,292 | A | 3/1974 | Curley et al. |
| 4,069,452 | A | 1/1978 | Conway et al. |

(Continued)

FOREIGN PATENT DOCUMENTS

| EP | 0132129 | 1/1985 |
| EP | 0644547 | 3/1995 |

(Continued)

OTHER PUBLICATIONS

Non-Final Office Action from U.S. Appl. No. 13/165,713, Dated May 22, 2012.

(Continued)

*Primary Examiner* — Tha-O H Bui
(74) *Attorney, Agent, or Firm* — Fish & Richardson P.C.

(57) ABSTRACT

An apparatus includes multiple first memory circuits, in which the multiple first memory circuits are positioned on at least one dual in-line memory module (DIMM). The apparatus includes an interface circuit operable to interface the first memory circuits with a system; present the first memory circuits to the system as one or more simulated second memory circuits; transmit, in response to receiving a first refresh control signal sent from the system to the one or more simulated memory circuits, multiple second refresh control signals to the first memory circuits; and apply a respective delay to each second refresh control signal transmitted to a corresponding first memory circuit. Each simulated second memory circuit has a corresponding second memory capacity that is greater than a first memory capacity of at least one of the first memory circuits.

19 Claims, 17 Drawing Sheets

(56) References Cited

U.S. PATENT DOCUMENTS

| | | | |
|---|---|---|---|
| 4,323,965 A | 4/1982 | Johnson et al. |
| 4,334,307 A | 6/1982 | Bourgeois et al. |
| 4,345,319 A | 8/1982 | Bernardini et al. |
| 4,392,212 A | 7/1983 | Miyasaka et al. |
| 4,500,958 A | 2/1985 | Manton et al. |
| 4,525,921 A | 7/1985 | Carson et al. |
| 4,566,082 A | 1/1986 | Anderson |
| 4,628,407 A | 12/1986 | August et al. |
| 4,646,128 A | 2/1987 | Carson et al. |
| 4,706,166 A | 11/1987 | Go |
| 4,764,846 A | 8/1988 | Go |
| 4,794,597 A | 12/1988 | Ooba et al. |
| 4,796,232 A | 1/1989 | House |
| 4,807,191 A | 2/1989 | Flannagan |
| 4,862,347 A | 8/1989 | Rudy ............... 703/14 |
| 4,884,237 A | 11/1989 | Mueller et al. |
| 4,887,240 A | 12/1989 | Garverick et al. |
| 4,888,687 A | 12/1989 | Allison et al. |
| 4,899,107 A | 2/1990 | Corbett et al. |
| 4,912,678 A | 3/1990 | Mashiko |
| 4,916,575 A | 4/1990 | Van Asten |
| 4,922,451 A | 5/1990 | Lo et al. |
| 4,937,791 A | 6/1990 | Steele et al. |
| 4,956,694 A | 9/1990 | Eide |
| 4,982,265 A | 1/1991 | Watanabe et al. |
| 4,983,533 A | 1/1991 | Go |
| 5,025,364 A | 6/1991 | Zellmer |
| 5,072,424 A | 12/1991 | Brent et al. |
| 5,104,820 A | 4/1992 | Go et al. |
| 5,193,072 A | 3/1993 | Frenkil et al. ............ 365/189.14 |
| 5,212,666 A | 5/1993 | Takeda |
| 5,222,014 A | 6/1993 | Lin |
| 5,241,266 A | 8/1993 | Ahmad et al. |
| 5,252,807 A | 10/1993 | Chizinsky |
| 5,278,796 A | 1/1994 | Tillinghast et al. |
| 5,332,922 A | 7/1994 | Oguchi et al. |
| 5,347,428 A | 9/1994 | Carson et al. |
| 5,369,749 A | 11/1994 | Baker et al. |
| 5,390,078 A | 2/1995 | Taylor |
| 5,390,334 A | 2/1995 | Harrison |
| 5,392,251 A * | 2/1995 | Manning ................ 365/222 |
| 5,408,190 A | 4/1995 | Wood et al. |
| 5,432,729 A | 7/1995 | Carson et al. |
| 5,448,511 A | 9/1995 | Paurus et al. |
| 5,453,434 A | 9/1995 | Albaugh et al. |
| 5,483,497 A | 1/1996 | Mochizuki et al. |
| 5,498,886 A | 3/1996 | Hsu et al. |
| 5,502,333 A | 3/1996 | Bertin et al. |
| 5,502,667 A | 3/1996 | Bertin et al. |
| 5,513,135 A | 4/1996 | Dell et al. |
| 5,513,339 A | 4/1996 | Agrawal et al. |
| 5,519,832 A | 5/1996 | Warchol |
| 5,550,781 A | 8/1996 | Sugawara et al. ............ 365/222 |
| 5,561,622 A | 10/1996 | Bertin et al. |
| 5,563,086 A | 10/1996 | Bertin et al. |
| 5,581,498 A | 12/1996 | Ludwig et al. |
| 5,590,071 A | 12/1996 | Kolor et al. |
| 5,606,710 A | 2/1997 | Hall et al. |
| 5,608,262 A | 3/1997 | Degani et al. |
| 5,654,204 A | 8/1997 | Anderson |
| 5,680,342 A | 10/1997 | Frankeny |
| 5,692,121 A | 11/1997 | Bozso et al. |
| 5,696,929 A | 12/1997 | Hasbun et al. |
| 5,702,984 A | 12/1997 | Bertin et al. |
| RE35,733 E | 2/1998 | Hernandez et al. |
| 5,742,792 A | 4/1998 | Yanai et al. |
| 5,760,478 A | 6/1998 | Bozso et al. |
| 5,761,703 A | 6/1998 | Bolyn |
| 5,765,203 A | 6/1998 | Sangha |
| 5,781,766 A | 7/1998 | Davis |
| 5,787,457 A | 7/1998 | Miller et al. |
| 5,802,395 A | 9/1998 | Connolly et al. |
| 5,802,555 A | 9/1998 | Shigeeda |
| 5,819,065 A | 10/1998 | Chilton et al. |
| 5,831,833 A | 11/1998 | Shirakawa et al. |
| 5,834,838 A | 11/1998 | Anderson |
| 5,838,165 A | 11/1998 | Chatter |
| 5,841,580 A | 11/1998 | Farmwald et al. |
| 5,843,799 A | 12/1998 | Hsu et al. |
| 5,843,807 A | 12/1998 | Burns |
| 5,870,350 A | 2/1999 | Bertin et al. |
| 5,872,907 A | 2/1999 | Griess et al. |
| 5,878,279 A | 3/1999 | Athenes |
| 5,910,010 A | 6/1999 | Nishizawa et al. |
| 5,913,072 A | 6/1999 | Wierenga |
| 5,915,167 A | 6/1999 | Leedy |
| 5,924,111 A | 7/1999 | Huang et al. |
| 5,926,435 A | 7/1999 | Park et al. |
| 5,929,650 A | 7/1999 | Pappert et al. |
| 5,943,254 A | 8/1999 | Bakeman, Jr. et al. |
| 5,953,215 A | 9/1999 | Karabatsos |
| 5,956,233 A | 9/1999 | Yew et al. |
| 5,960,468 A | 9/1999 | Paluch |
| 5,962,435 A | 10/1999 | Mao et al. |
| 5,963,429 A | 10/1999 | Chen |
| 5,966,727 A | 10/1999 | Nishino |
| 5,969,996 A | 10/1999 | Muranaka et al. |
| 5,973,392 A | 10/1999 | Senba et al. |
| 5,978,304 A | 11/1999 | Crafts |
| 5,995,424 A | 11/1999 | Lawrence et al. |
| 6,001,671 A | 12/1999 | Fjelstad |
| 6,026,027 A | 2/2000 | Terrell, II et al. |
| 6,026,050 A | 2/2000 | Baker et al. |
| 6,029,250 A | 2/2000 | Keeth |
| 6,034,916 A | 3/2000 | Lee |
| 6,044,028 A | 3/2000 | Kumagai et al. |
| 6,047,073 A | 4/2000 | Norris et al. |
| 6,047,344 A | 4/2000 | Kawasumi et al. |
| 6,047,361 A | 4/2000 | Ingenio et al. |
| 6,053,948 A | 4/2000 | Vaidyanathan et al. |
| 6,058,451 A | 5/2000 | Bermingham et al. |
| 6,065,092 A | 5/2000 | Roy |
| 6,070,217 A | 5/2000 | Connolly et al. |
| 6,075,744 A | 6/2000 | Tsern et al. |
| 6,091,251 A | 7/2000 | Wood et al. |
| 6,101,564 A | 8/2000 | Athenes et al. |
| 6,111,812 A | 8/2000 | Gans et al. |
| 6,134,638 A | 10/2000 | Olarig et al. |
| 6,181,640 B1 | 1/2001 | Kang |
| 6,199,151 B1 | 3/2001 | Williams et al. |
| 6,216,246 B1 | 4/2001 | Shau |
| 6,226,709 B1 | 5/2001 | Goodwin et al. |
| 6,226,730 B1 | 5/2001 | Murdoch et al. |
| 6,233,650 B1 | 5/2001 | Johnson et al. |
| 6,253,278 B1 | 6/2001 | Ryan |
| 6,266,292 B1 | 7/2001 | Tsern et al. |
| 6,274,395 B1 | 8/2001 | Weber |
| 6,279,069 B1 | 8/2001 | Robinson et al. |
| 6,297,966 B1 | 10/2001 | Lee et al. |
| 6,304,511 B1 | 10/2001 | Gans et al. |
| 6,307,769 B1 | 10/2001 | Nuxoll et al. |
| 6,317,352 B1 | 11/2001 | Halbert et al. |
| 6,317,381 B1 | 11/2001 | Gans et al. |
| 6,336,174 B1 | 1/2002 | Li et al. |
| 6,338,113 B1 | 1/2002 | Kubo et al. |
| 6,341,347 B1 | 1/2002 | Joy et al. |
| 6,343,019 B1 | 1/2002 | Jiang et al. |
| 6,343,042 B1 | 1/2002 | Tsern et al. |
| 6,381,668 B1 | 4/2002 | Lunteren |
| 6,389,514 B1 | 5/2002 | Rokicki |
| 6,392,304 B1 | 5/2002 | Butler |
| 6,414,868 B1 | 7/2002 | Wong et al. |
| 6,418,034 B1 | 7/2002 | Weber et al. |
| 6,421,754 B1 | 7/2002 | Kau et al. |
| 6,424,532 B2 | 7/2002 | Kawamura |
| 6,429,029 B1 | 8/2002 | Eldridge et al. |
| 6,430,103 B1 | 8/2002 | Nakayama et al. |
| 6,434,660 B1 | 8/2002 | Lambert et al. |
| 6,438,057 B1 | 8/2002 | Ruckerbauer |
| 6,445,591 B1 | 9/2002 | Kwong |
| 6,452,826 B1 | 9/2002 | Kim et al. |
| 6,453,402 B1 | 9/2002 | Jeddeloh |
| 6,453,434 B2 | 9/2002 | Delp et al. |
| 6,455,348 B1 | 9/2002 | Yamaguchi |

(56) References Cited

U.S. PATENT DOCUMENTS

| | | | |
|---|---|---|---|
| 6,473,831 B1 | 10/2002 | Schade |
| 6,476,476 B1 | 11/2002 | Glenn |
| 6,480,929 B1 | 11/2002 | Gauthier et al. |
| 6,487,102 B1 | 11/2002 | Halbert et al. |
| 6,489,669 B2 | 12/2002 | Shimada et al. |
| 6,490,161 B1 | 12/2002 | Johnson |
| 6,492,726 B1 | 12/2002 | Quek et al. |
| 6,510,097 B2 | 1/2003 | Fukuyama |
| 6,512,392 B2 | 1/2003 | Fleury et al. |
| 6,521,984 B2 | 2/2003 | Matsuura |
| 6,526,473 B1 | 2/2003 | Kim |
| 6,545,895 B1 | 4/2003 | Li et al. |
| 6,553,450 B1 | 4/2003 | Dodd et al. ............... 711/105 |
| 6,560,158 B2 | 5/2003 | Choi et al. |
| 6,587,912 B2 | 7/2003 | Leddige et al. |
| 6,590,822 B2 | 7/2003 | Hwang et al. |
| 6,597,616 B2 | 7/2003 | Tsern et al. |
| 6,618,267 B1 | 9/2003 | Dalal et al. |
| 6,628,538 B2 | 9/2003 | Funaba et al. |
| 6,629,282 B1 | 9/2003 | Sugamori et al. |
| 6,630,729 B2 | 10/2003 | Huang |
| 6,639,820 B1 | 10/2003 | Khandekar et al. |
| 6,650,588 B2 * | 11/2003 | Yamagata ............... 365/222 |
| 6,650,594 B1 | 11/2003 | Lee et al. |
| 6,657,634 B1 | 12/2003 | Sinclair et al. |
| 6,658,016 B1 | 12/2003 | Dai et al. |
| 6,659,512 B1 | 12/2003 | Harper et al. |
| 6,664,625 B2 | 12/2003 | Hiruma |
| 6,668,242 B1 | 12/2003 | Reynov et al. |
| 6,674,154 B2 | 1/2004 | Minamio et al. |
| 6,683,372 B1 | 1/2004 | Wong et al. |
| 6,684,292 B2 | 1/2004 | Piccirillo et al. |
| 6,690,191 B2 | 2/2004 | Wu et al. |
| 6,705,877 B1 | 3/2004 | Li et al. |
| 6,710,430 B2 | 3/2004 | Minamio et al. |
| 6,711,043 B2 | 3/2004 | Friedman et al. ........... 365/51 |
| 6,713,856 B2 | 3/2004 | Tsai et al. |
| 6,714,433 B2 | 3/2004 | Doblar et al. |
| 6,730,540 B2 | 5/2004 | Siniaguine |
| 6,731,009 B1 | 5/2004 | Jones et al. |
| 6,731,527 B2 | 5/2004 | Brown |
| 6,742,098 B1 | 5/2004 | Halbert et al. |
| 6,747,887 B2 | 6/2004 | Halbert et al. |
| 6,757,751 B1 | 6/2004 | Gene |
| 6,762,948 B2 | 7/2004 | Kyun et al. |
| 6,766,469 B2 | 7/2004 | Larson et al. |
| 6,785,767 B2 | 8/2004 | Coulson |
| 6,791,877 B2 | 9/2004 | Miura et al. |
| 6,799,241 B2 | 9/2004 | Kahn et al. |
| 6,801,989 B2 | 10/2004 | Johnson et al. |
| 6,807,650 B2 | 10/2004 | Lamb et al. |
| 6,807,655 B1 | 10/2004 | Rehani et al. |
| 6,810,475 B1 | 10/2004 | Tardieux |
| 6,845,027 B2 | 1/2005 | Mayer et al. |
| 6,854,043 B2 * | 2/2005 | Hargis et al. ............. 711/168 |
| 6,878,570 B2 | 4/2005 | Lyu et al. |
| 6,894,933 B2 | 5/2005 | Kuzmenka et al. |
| 6,908,314 B2 | 6/2005 | Brown |
| 6,912,778 B2 | 7/2005 | Ahn et al. |
| 6,914,786 B1 | 7/2005 | Paulsen et al. |
| 6,917,219 B2 | 7/2005 | New |
| 6,922,371 B2 | 7/2005 | Takahashi et al. |
| 6,943,450 B2 | 9/2005 | Fee et al. |
| 6,944,748 B2 | 9/2005 | Sanches et al. |
| 6,947,341 B2 | 9/2005 | Stubbs et al. |
| 6,951,982 B2 | 10/2005 | Chye et al. |
| 6,952,794 B2 | 10/2005 | Lu |
| 6,968,419 B1 | 11/2005 | Holman |
| 6,970,968 B1 | 11/2005 | Holman |
| 7,007,095 B2 | 2/2006 | Chen et al. |
| 7,024,518 B2 | 4/2006 | Halbert et al. |
| 7,026,708 B2 | 4/2006 | Cady et al. |
| 7,028,215 B2 | 4/2006 | Depew et al. |
| 7,043,599 B1 | 5/2006 | Ware et al. |
| 7,043,611 B2 | 5/2006 | McClannahan et al. |
| 7,045,396 B2 | 5/2006 | Crowley et al. |
| 7,045,901 B2 | 5/2006 | Lin et al. |
| 7,053,470 B1 | 5/2006 | Sellers et al. |
| 7,053,478 B2 | 5/2006 | Roper et al. |
| 7,058,863 B2 | 6/2006 | Kouchi et al. |
| 7,066,741 B2 | 6/2006 | Burns et al. |
| 7,075,175 B2 | 7/2006 | Kazi et al. |
| 7,079,396 B2 | 7/2006 | Gates et al. |
| 7,079,446 B2 | 7/2006 | Murtagh et al. |
| 7,085,152 B2 | 8/2006 | Ellis et al. |
| 7,093,101 B2 | 8/2006 | Aasheim et al. |
| 7,111,143 B2 | 9/2006 | Walker |
| 7,117,309 B2 | 10/2006 | Bearden |
| 7,119,428 B2 | 10/2006 | Tanie et al. |
| 7,120,727 B2 | 10/2006 | Lee et al. |
| 7,127,567 B2 | 10/2006 | Ramakrishnan et al. |
| 7,133,960 B1 | 11/2006 | Thompson et al. |
| 7,136,978 B2 | 11/2006 | Miura et al. |
| 7,138,823 B2 | 11/2006 | Janzen et al. |
| 7,173,863 B2 | 2/2007 | Conley et al. |
| 7,200,021 B2 | 4/2007 | Raghuram |
| 7,210,059 B2 | 4/2007 | Jeddeloh |
| 7,215,561 B2 | 5/2007 | Park et al. |
| 7,218,566 B1 | 5/2007 | Totolos, Jr. et al. |
| 7,231,562 B2 | 6/2007 | Ohlhoff et al. |
| 7,233,541 B2 | 6/2007 | Yamamoto et al. |
| 7,234,081 B2 | 6/2007 | Nguyen et al. |
| 7,243,185 B2 | 7/2007 | See et al. |
| 7,254,036 B2 | 8/2007 | Pauley et al. |
| 7,266,639 B2 | 9/2007 | Raghuram |
| 7,269,042 B2 | 9/2007 | Kinsley et al. |
| 7,274,583 B2 | 9/2007 | Park et al. |
| 7,277,333 B2 | 10/2007 | Schaefer |
| 7,286,436 B2 | 10/2007 | Bhakta et al. |
| 7,289,386 B2 | 10/2007 | Bhakta et al. |
| 7,296,754 B2 | 11/2007 | Nishizawa et al. |
| 7,302,598 B2 | 11/2007 | Suzuki et al. |
| 7,317,250 B2 | 1/2008 | Koh et al. |
| 7,327,613 B2 | 2/2008 | Lee |
| 7,336,490 B2 | 2/2008 | Harris et al. |
| 7,337,293 B2 | 2/2008 | Brittain et al. |
| 7,363,422 B2 | 4/2008 | Perego et al. |
| 7,366,947 B2 | 4/2008 | Gower et al. |
| 7,379,316 B2 | 5/2008 | Rajan |
| 7,409,492 B2 | 8/2008 | Tanaka et al. |
| 7,414,917 B2 | 8/2008 | Ruckerbauer et al. |
| 7,428,644 B2 | 9/2008 | Jeddeloh et al. |
| 7,437,579 B2 | 10/2008 | Jeddeloh et al. |
| 7,441,064 B2 | 10/2008 | Gaskins |
| 7,457,122 B2 | 11/2008 | Lai et al. |
| 7,464,225 B2 | 12/2008 | Tsern |
| 7,472,220 B2 | 12/2008 | Rajan et al. |
| 7,474,576 B2 | 1/2009 | Co et al. |
| 7,480,147 B2 | 1/2009 | Hoss et al. |
| 7,480,774 B2 | 1/2009 | Ellis et al. |
| 7,496,777 B2 | 2/2009 | Kapil |
| 7,499,281 B2 | 3/2009 | Harris et al. |
| 7,515,453 B2 | 4/2009 | Rajan |
| 7,532,537 B2 | 5/2009 | Solomon et al. |
| 7,539,800 B2 | 5/2009 | Dell et al. |
| 7,573,136 B2 | 8/2009 | Jiang et al. |
| 7,580,312 B2 | 8/2009 | Rajan et al. |
| 7,581,121 B2 | 8/2009 | Barth et al. |
| 7,581,127 B2 | 8/2009 | Rajan et al. |
| 7,590,796 B2 | 9/2009 | Rajan et al. |
| 7,599,205 B2 | 10/2009 | Rajan |
| 7,606,245 B2 | 10/2009 | Ma et al. |
| 7,609,567 B2 | 10/2009 | Rajan et al. |
| 7,613,880 B2 | 11/2009 | Miura et al. |
| 7,619,912 B2 | 11/2009 | Bhakta et al. |
| 7,724,589 B2 | 5/2010 | Rajan et al. |
| 7,730,338 B2 | 6/2010 | Rajan et al. |
| 7,738,252 B2 | 6/2010 | Schuette et al. |
| 7,761,724 B2 | 7/2010 | Rajan et al. |
| 7,791,889 B2 | 9/2010 | Belady et al. |
| 7,911,798 B2 | 3/2011 | Chang et al. |
| 7,934,070 B2 | 4/2011 | Brittain et al. |
| 7,990,797 B2 | 8/2011 | Moshayedi et al. |
| 8,116,144 B2 | 2/2012 | Shaw et al. |

(56) References Cited

U.S. PATENT DOCUMENTS

| | | |
|---|---|---|
| 2001/0003198 A1 | 6/2001 | Wu |
| 2001/0011322 A1 | 8/2001 | Stolt et al. |
| 2001/0019509 A1 | 9/2001 | Aho et al. |
| 2001/0021106 A1 | 9/2001 | Weber et al. |
| 2001/0046129 A1 | 11/2001 | Broglia et al. |
| 2001/0046163 A1 | 11/2001 | Yaganawa |
| 2001/0052062 A1 | 12/2001 | Lipovski |
| 2002/0002662 A1 | 1/2002 | Olarig et al. |
| 2002/0004897 A1 | 1/2002 | Kao et al. |
| 2002/0015340 A1 | 2/2002 | Batinovich |
| 2002/0034068 A1 | 3/2002 | Weber et al. |
| 2002/0038405 A1 | 3/2002 | Leddige et al. |
| 2002/0040416 A1 | 4/2002 | Tsern et al. |
| 2002/0051398 A1 | 5/2002 | Mizugaki |
| 2002/0060945 A1 | 5/2002 | Ikeda |
| 2002/0064083 A1 | 5/2002 | Ryu et al. |
| 2002/0089831 A1 | 7/2002 | Forthun |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0129204 A1 | 9/2002 | Leighnor et al. |
| 2002/0167092 A1 | 11/2002 | Fee et al. |
| 2002/0172024 A1 | 11/2002 | Hui et al. |
| 2002/0174274 A1 | 11/2002 | Wu et al. |
| 2003/0011993 A1 | 1/2003 | Summers et al. |
| 2003/0016550 A1 | 1/2003 | Yoo et al. |
| 2003/0026155 A1 | 2/2003 | Yamagata |
| 2003/0026159 A1 | 2/2003 | Frankowsky et al. |
| 2003/0035312 A1 | 2/2003 | Halbert et al. |
| 2003/0041295 A1 | 2/2003 | Hou et al. |
| 2003/0061459 A1 | 3/2003 | Aboulenein et al. |
| 2003/0083855 A1 | 5/2003 | Fukuyama |
| 2003/0088743 A1 | 5/2003 | Rader |
| 2003/0110339 A1 | 6/2003 | Calvignac et al. |
| 2003/0123389 A1 | 7/2003 | Russell et al. |
| 2003/0127737 A1 | 7/2003 | Takahashi |
| 2003/0145163 A1 | 7/2003 | Seo et al. |
| 2003/0164539 A1 | 9/2003 | Yau |
| 2003/0164543 A1 | 9/2003 | Kheng Lee |
| 2003/0174569 A1 | 9/2003 | Amidi |
| 2003/0183934 A1 | 10/2003 | Barrett |
| 2003/0205802 A1 | 11/2003 | Segaram et al. |
| 2003/0223290 A1 | 12/2003 | Park et al. |
| 2003/0230801 A1 | 12/2003 | Jiang et al. |
| 2003/0234664 A1 | 12/2003 | Yamagata |
| 2004/0016994 A1 | 1/2004 | Huang |
| 2004/0034755 A1 | 2/2004 | LaBerge et al. |
| 2004/0037133 A1 | 2/2004 | Park et al. |
| 2004/0042503 A1 | 3/2004 | Shaeffer et al. |
| 2004/0049624 A1 | 3/2004 | Salmonsen |
| 2004/0064647 A1 | 4/2004 | DeWhitt et al. |
| 2004/0083324 A1 | 4/2004 | Rabinovitz et al. |
| 2004/0100837 A1 | 5/2004 | Lee |
| 2004/0123173 A1 | 6/2004 | Emberling et al. |
| 2004/0125635 A1 | 7/2004 | Kuzmenka |
| 2004/0133374 A1 | 7/2004 | Kattan |
| 2004/0133736 A1 | 7/2004 | Kyung |
| 2004/0139359 A1 | 7/2004 | Samson et al. |
| 2004/0195682 A1 | 10/2004 | Kimura |
| 2004/0205433 A1 | 10/2004 | Gower et al. |
| 2004/0208173 A1 | 10/2004 | Di Gregorio |
| 2004/0225858 A1 | 11/2004 | Brueggen |
| 2004/0228166 A1 | 11/2004 | Braun et al. |
| 2004/0228196 A1 | 11/2004 | Kwak et al. |
| 2004/0236877 A1 | 11/2004 | Burton |
| 2004/0250989 A1 | 12/2004 | Im et al. |
| 2004/0257847 A1 | 12/2004 | Matsui et al. |
| 2004/0264255 A1 | 12/2004 | Royer |
| 2005/0027928 A1 | 2/2005 | Avraham et al. |
| 2005/0034004 A1 | 2/2005 | Bunker et al. |
| 2005/0036350 A1 | 2/2005 | So et al. |
| 2005/0041504 A1 | 2/2005 | Perego et al. |
| 2005/0044302 A1 | 2/2005 | Pauley et al. |
| 2005/0044303 A1 | 2/2005 | Perego et al. |
| 2005/0071543 A1 | 3/2005 | Ellis et al. |
| 2005/0078532 A1 | 4/2005 | Ruckerbauer et al. |
| 2005/0081085 A1 | 4/2005 | Ellis et al. |
| 2005/0086548 A1 | 4/2005 | Haid et al. |
| 2005/0099834 A1 | 5/2005 | Funaba et al. |
| 2005/0105318 A1 | 5/2005 | Funaba et al. |
| 2005/0108460 A1 | 5/2005 | David |
| 2005/0127531 A1 | 6/2005 | Tay et al. |
| 2005/0135176 A1 | 6/2005 | Ramakrishnan et al. |
| 2005/0138267 A1 | 6/2005 | Bains et al. |
| 2005/0138304 A1 | 6/2005 | Ramakrishnan et al. |
| 2005/0139977 A1 | 6/2005 | Nishio et al. |
| 2005/0156934 A1 | 7/2005 | Perego et al. |
| 2005/0193183 A1 | 9/2005 | Barth et al. |
| 2005/0194676 A1 | 9/2005 | Fukuda et al. |
| 2005/0201063 A1 | 9/2005 | Lee et al. |
| 2005/0207255 A1 | 9/2005 | Perego et al. |
| 2005/0210196 A1 | 9/2005 | Perego et al. |
| 2005/0224948 A1 | 10/2005 | Lee et al. |
| 2005/0232049 A1 | 10/2005 | Park |
| 2005/0235119 A1 | 10/2005 | Sechrest et al. |
| 2005/0237838 A1 | 10/2005 | Kwak et al. |
| 2005/0243635 A1 | 11/2005 | Schaefer |
| 2005/0246558 A1 | 11/2005 | Ku |
| 2005/0263312 A1 | 12/2005 | Bolken et al. |
| 2005/0269715 A1 | 12/2005 | Yoo |
| 2005/0281096 A1 | 12/2005 | Bhakta et al. |
| 2005/0286334 A1 | 12/2005 | Saito et al. |
| 2006/0002201 A1 | 1/2006 | Janzen |
| 2006/0026484 A1 | 2/2006 | Hollums |
| 2006/0038597 A1 | 2/2006 | Becker et al. |
| 2006/0039204 A1 | 2/2006 | Cornelius |
| 2006/0041730 A1 | 2/2006 | Larson |
| 2006/0044909 A1 | 3/2006 | Kinsley et al. |
| 2006/0049502 A1 | 3/2006 | Goodwin et al. |
| 2006/0056244 A1 | 3/2006 | Ware |
| 2006/0062047 A1 | 3/2006 | Bhakta et al. |
| 2006/0085616 A1 | 4/2006 | Zeighami et al. |
| 2006/0087900 A1 | 4/2006 | Bucksch et al. |
| 2006/0090031 A1 | 4/2006 | Kirshenbaum et al. |
| 2006/0112219 A1 | 5/2006 | Chawla et al. |
| 2006/0117152 A1 | 6/2006 | Amidi et al. |
| 2006/0118933 A1 | 6/2006 | Haba |
| 2006/0129712 A1 | 6/2006 | Raghuram |
| 2006/0129740 A1 | 6/2006 | Ruckerbauer et al. |
| 2006/0136791 A1 | 6/2006 | Nierle |
| 2006/0149857 A1 | 7/2006 | Holman |
| 2006/0174082 A1 | 8/2006 | Bellows et al. |
| 2006/0180926 A1 | 8/2006 | Mullen et al. |
| 2006/0181953 A1 | 8/2006 | Rotenberg et al. |
| 2006/0195631 A1 | 8/2006 | Rajamani |
| 2006/0236165 A1 | 10/2006 | Cepulis et al. |
| 2006/0236201 A1 | 10/2006 | Gower et al. |
| 2006/0248261 A1 | 11/2006 | Jacob et al. |
| 2006/0248387 A1 | 11/2006 | Nicholson et al. |
| 2006/0262586 A1 | 11/2006 | Solomon et al. |
| 2006/0262587 A1 | 11/2006 | Matsui et al. |
| 2006/0277355 A1 | 12/2006 | Ellsberry et al. |
| 2006/0294295 A1 | 12/2006 | Fukuzo |
| 2007/0005998 A1 | 1/2007 | Jain et al. |
| 2007/0050530 A1 | 3/2007 | Rajan |
| 2007/0058471 A1 | 3/2007 | Rajan et al. |
| 2007/0088995 A1 | 4/2007 | Tsern et al. |
| 2007/0091696 A1 | 4/2007 | Niggemeier et al. |
| 2007/0136537 A1 | 6/2007 | Doblar et al. |
| 2007/0152313 A1 | 7/2007 | Periaman et al. |
| 2007/0162700 A1 | 7/2007 | Fortin et al. |
| 2007/0188997 A1 | 8/2007 | Hockanson et al. |
| 2007/0192563 A1 | 8/2007 | Rajan et al. |
| 2007/0195613 A1 | 8/2007 | Rajan et al. |
| 2007/0204075 A1 | 8/2007 | Rajan et al. |
| 2007/0279084 A1 | 12/2007 | Oh et al. |
| 2007/0285895 A1 | 12/2007 | Gruendler et al. |
| 2007/0288683 A1 | 12/2007 | Panabaker et al. |
| 2007/0288686 A1 | 12/2007 | Arcedera et al. |
| 2007/0288687 A1 | 12/2007 | Panabaker et al. |
| 2007/0290333 A1 | 12/2007 | Saini et al. |
| 2008/0002447 A1 | 1/2008 | Gulachenski et al. |
| 2008/0010435 A1 | 1/2008 | Smith et al. |
| 2008/0025108 A1 | 1/2008 | Rajan et al. |

(56) References Cited

U.S. PATENT DOCUMENTS

| | | |
|---|---|---|
| 2008/0025122 A1 | 1/2008 | Schakel et al. |
| 2008/0025136 A1 | 1/2008 | Rajan et al. |
| 2008/0025137 A1 | 1/2008 | Rajan et al. |
| 2008/0027697 A1 | 1/2008 | Rajan et al. |
| 2008/0027702 A1 | 1/2008 | Rajan et al. |
| 2008/0027703 A1 | 1/2008 | Rajan et al. |
| 2008/0028135 A1 | 1/2008 | Rajan et al. |
| 2008/0028136 A1 | 1/2008 | Schakel et al. |
| 2008/0028137 A1 | 1/2008 | Schakel et al. |
| 2008/0031030 A1 | 2/2008 | Rajan et al. |
| 2008/0031072 A1 | 2/2008 | Rajan et al. |
| 2008/0034130 A1 | 2/2008 | Perego et al. |
| 2008/0037353 A1 | 2/2008 | Rajan et al. |
| 2008/0056014 A1 | 3/2008 | Rajan et al. |
| 2008/0062773 A1 | 3/2008 | Rajan et al. |
| 2008/0082763 A1 | 4/2008 | Rajan et al. |
| 2008/0086588 A1 | 4/2008 | Danilak et al. |
| 2008/0089034 A1 | 4/2008 | Hoss et al. |
| 2008/0098277 A1 | 4/2008 | Hazelzet |
| 2008/0103753 A1 | 5/2008 | Rajan et al. |
| 2008/0104314 A1 | 5/2008 | Rajan et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1 | 5/2008 | Schakel et al. |
| 2008/0115006 A1 | 5/2008 | Smith et al. |
| 2008/0120443 A1 | 5/2008 | Rajan et al. |
| 2008/0120458 A1 | 5/2008 | Gillingham et al. |
| 2008/0123459 A1 | 5/2008 | Rajan et al. |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126690 A1 | 5/2008 | Rajan et al. |
| 2008/0126692 A1 | 5/2008 | Rajan et al. |
| 2008/0130364 A1 | 6/2008 | Guterman et al. |
| 2008/0133825 A1 | 6/2008 | Rajan et al. |
| 2008/0155136 A1 | 6/2008 | Hishino |
| 2008/0159027 A1 | 7/2008 | Kim |
| 2008/0170425 A1 | 7/2008 | Rajan |
| 2008/0195894 A1 | 8/2008 | Schreck et al. |
| 2008/0239857 A1 | 10/2008 | Rajan et al. |
| 2008/0239858 A1 | 10/2008 | Rajan et al. |
| 2008/0282084 A1 | 11/2008 | Hatakeyama |
| 2008/0282341 A1 | 11/2008 | Hatakeyama |
| 2009/0024789 A1 | 1/2009 | Rajan et al. |
| 2009/0024790 A1 | 1/2009 | Rajan et al. |
| 2009/0049266 A1 | 2/2009 | Kuhne |
| 2009/0063865 A1 | 3/2009 | Berenbaum et al. |
| 2009/0063896 A1 | 3/2009 | Lastras-Montano et al. |
| 2009/0070520 A1 | 3/2009 | Mizushima |
| 2009/0089480 A1 | 4/2009 | Wah et al. |
| 2009/0109613 A1 | 4/2009 | Legen et al. |
| 2009/0180926 A1 | 7/2009 | Petruno et al. |
| 2009/0216939 A1 | 8/2009 | Smith et al. |
| 2009/0285031 A1 | 11/2009 | Rajan et al. |
| 2009/0290442 A1 | 11/2009 | Rajan |
| 2010/0005218 A1 | 1/2010 | Gower et al. |
| 2010/0020585 A1 | 1/2010 | Rajan |
| 2010/0257304 A1 | 10/2010 | Rajan et al. |
| 2010/0271888 A1 | 10/2010 | Rajan |
| 2010/0281280 A1 | 11/2010 | Rajan et al. |

FOREIGN PATENT DOCUMENTS

| | | |
|---|---|---|
| JP | 01171047 | 7/1989 |
| JP | 03286234 | 12/1991 |
| JP | 05-298192 | 11/1993 |
| JP | 07-141870 | 6/1995 |
| JP | 10233091 | 10/1998 |
| JP | 11-149775 | 6/1999 |
| JP | 3304893 B2 | 5/2002 |
| JP | 2002288037 | 10/2002 |
| JP | 04-327474 | 11/2004 |
| JP | 2005062914 | 3/2005 |
| KR | 1999-0076659 | 10/1999 |
| KR | 2005120344 | 12/2005 |
| WO | WO97/25674 | 7/1997 |
| WO | 9900734 | 1/1999 |
| WO | WO00/45270 | 8/2000 |
| WO | 01/90900 | 11/2001 |
| WO | 01/97160 | 12/2001 |
| WO | WO2004/044754 | 5/2004 |
| WO | WO2004/051645 | 6/2004 |
| WO | WO2006/072040 | 7/2006 |
| WO | 2007/028109 | 3/2007 |
| WO | 2007/095080 | 8/2007 |
| WO | 2008/063251 | 5/2008 |

OTHER PUBLICATIONS

Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
Buffer Device for Memory Modules (DIMM), IP.com Prior Art Database, <URL:http://ip.com/IPCOM/000144850>, Feb. 10, 2007, 1 pg.
Final Office Action from U.S. Appl. No. 11/929,571 Dated Mar. 3, 2011.
Final Office Action from U.S. Appl. No. 11/461,435 mailed on Jan. 28, 2009.
Final Office Action from U.S. Appl. No. 11/461,420 Dated Jul. 20, 2011.
Final Office Action from U.S. Appl. No. 11/461,420 Mailed Apr. 28, 2010.
Final Office Action from U.S. Appl. No. 11/461,435 Dated May 13, 2010.
Final Office Action from U.S. Appl. No. 11/461,435 Mailed Jan. 28, 2009.
Final Office Action from U.S. Appl. No. 11/515,167 Dated Jun. 3, 2010.
Final Office Action from U.S. Appl. No. 11/553,390 Dated Jun. 24, 2010.
Final Office Action from U.S. Appl. No. 11/588,739 Dated Dec. 15, 2010.
Final Office Action from U.S. Appl. No. 11/672,921 Dated Jul. 23, 2010.
Final Office Action from U.S. Appl. No. 11/672,924 Dated Sep. 7, 2010.
Final Office Action from U.S. Appl. No. 11/702,960 Dated Jun. 21, 2010.
Final Office Action from U.S. Appl. No. 11/828,182 Dated Dec. 22, 2010.
Final Office Action from U.S. Appl. No 11/855.805, Dated May 26, 2011.
Final Office Action from U.S. Appl. No. 11/858,518 Mailed Apr. 21, 2010.
Final Office Action from U.S. Appl. No. 11/929,225 Dated Aug. 27, 2010.
Final Office Action from U.S. Appl. No. 11/929,261 Dated Sep. 7. 2014.
Final Office Action from U.S. Appl. No. 11/929,286 Dated Aug. 20, 2010.
Final Office Action from U.S. Appl. No. 11/929,403 Dated Aug. 31, 2010.
Final Office Action from U.S. Appl. No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Final Office Action from U.S. Appl. No. 11/929,500 Dated Jun. 24, 2010.
Final Office Action from U.S. Appl. No. 11/929,631 Dated Nov. 18, 2010.

(56) References Cited

OTHER PUBLICATIONS

Final Office Action from U.S. Appl. No. 11/929,655 Dated Nov. 22, 2010.
Final Office Action from U.S. Appl. No. 11/939,440 Dated May 19, 2011.
Final Office Action from U.S. Appl. No. 12/057,306 Dated Jun. 15, 2011.
Final Office Action from U.S. Appl. No. 12/507,682 Dated Mar. 29, 2011.
Final Office Action from U.S. Appl. No. 12/574,628 Dated Mar. 3, 2011.
Final Office Action from U.S. Appl. No. 12/769,428 Dated Jun. 16, 2011.
Final Rejection from U.S. Appl. No. 11/461,437 Mailed Nov. 10, 2009.
Final Rejection from U.S. Appl. No. 11/762,010 Mailed Dec. 4, 2009.
German Office Action from German Patent Application No. 11 2006 001 810.8-55 Mailed Apr. 20, 2009 (With Translation).
German Office Action from German Patent Application No. 11 2006 002 300.4-55 Dated May 11, 2009 (With Translation).
German Office Action From German Patent Application No. 11 2006 002 300.4-55 Mailed Jun. 5, 2009 (With Translation).
Great Britain Office Action from GB Patent Application No. GB0800734.6 Mailed Mar. 1, 2010.
Great Britain Office Action from GB Patent Application No. GB0803913.3 Mailed Mar. 1, 2010.
Great Britain Office Action from GB Patent Application No. GB0803913.3 Dated Mar. 1, 2010.
International Prrliminary Examination Report From PCT Application No. PCT/US07/016385 Dated Feb. 3, 2009.
Non-final Office Action from U.S. Appl. No. 11/461,430 mailed on Feb. 19, 2009.
Non-final Office Action from U.S. Appl. No. 11/461,437 mailed on Jan. 26, 2009.
Non-final Office Action from U.S. Appl. No. 11/939,432 mailed on Feb. 6, 2009.
Non-Final Office Action from U.S. Appl. No. 11/461,420 Dated Jul. 23, 2009.
Non-Final Office Action from U.S. Appl. No. 11/461,430 Mailed Feb. 19, 2009.
Non-Final Office Action from U.S. Appl. No. 11/461,435 Dated Aug. 5, 2009.
Non-Final Office Action from U.S. Appl. No. 11/461,437 Mailed Jan. 26, 2009.
Non-Final Office Action from U.S. Appl. No. 11/461,441 Mailed Apr. 2, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553.372 Dated Jun. 25, 2009.
Non-Final Office Action from U.S. Appl. No. 11/553,372 Dated Jan. 5, 2011.
Non-Final Office Action from U.S. Appl. No. 11/553,390 Dated Sep. 9, 2009.
Non-Final Office Action from U.S. Appl. No. 11/553,399 Dated Jul. 7, 2009.
Non-Final Office Action from U.S. Appl. No. 11/588,739 Mailed Dec. 29, 2009.
Non-Final Office Action from U.S. Appl. No. 11/611,374 Mailed Mar. 23, 2009.
Non-Final Office Action from U.S. Appl. No. 11/672,921 Dated May 27, 2011.
Non-Final Office Action from U.S. Appl. No. 11/672,974 Dated Jun. 8, 2011.
Non-Final Office Action from U.S. Appl. No. 11/702,960 Dated Sep. 25, 2009.
Non-Final Office Action from U.S. Appl. No. 11/702,960 Dated Jun. 23, 2011.
Non-Final Office Action from U.S. Appl. No. 11/702,981 Dated Aug. 19, 2009.
Non-Final Office Action from U.S. Appl. No. 11/702,981 Dated Mar. 11, 2009.
Non-Final Office Action from U.S. Appl. No. 11/762,010 Mailed Mar. 20, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/828,181 Dated Jun. 27, 2011.
Non-Final Office Action from U.S. Appl. No. 11/828,181 Mailed Mar. 2, 2010.
Non-Final Office Action from U.S. Appl. No. 11/828,182 Dated Jun. 27, 2011.
Non-Final Office Action from U.S. Appl. No. 11/828,182 Mailed Mar. 29, 2010.
Non-Final Office Action from U.S. Appl. No. 11/855,805 Dated Sep. 21, 2010.
Non-Final Office Action from U.S. Appl. No. 11/855,826 Dated Jan. 13, 2011.
Non-Final Office Action from U.S. Appl. No. 11/858,518 Dated Aug. 14, 2009.
Non-Final Office Action from U.S. Appl. No. 11/858,518 Dated Sep. 8, 2010.
Non-Final Office Action from U.S. Appl. No. 11/858,518 Dated Sep. 27, 2011.
Non-Final Office Action from U.S. Appl. No. 11/929,225 Dated Jun. 8, 2011.
Non-Final Office Action from U.S. Appl. No. 11/929,403 Dated Mar. 31, 2011.
Non-Final Office Action from U.S. Appl. No. 11/929,417 Dated Mar. 31, 2011.
Non-Final Office Action from U.S. Appl. No. 11/929,432 Mailed Jan. 14, 2010.
Non-Final Office Action from U.S. Appl. No. 11/929,500 Dated Oct. 13, 2009.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,636 Mailed Mar. 9, 2010.
Non-Final Office Action from U.S. Appl. No. 11/929,655 Dated Jun. 24, 2011.
Non-Final Office Action from U.S. Appl. No. 11/929,655 Mailed Mar. 3, 2010.
Non-Final Office Action from U.S. Appl. No. 11/939,432 Mailed Apr. 12, 2010.
Non-Final Office Action from U.S. Appl. No. 11/939,432 Mailed Feb. 6, 2009.
Non-Final Office Action from U.S. Appl. No. 11/939,440 Dated Sep. 17, 2010.
Non-Final Office Action from U.S. Appl. No. 11/941,589 Dated Oct. 1, 2009.
Non-Final Office Action from U.S. Appl. No. 12/057,306 Dated Oct. 8, 2010.
Non-Final Office Action from U.S. Appl. No. 12/111,819 Mailed Apr. 27, 2009.
Non-Final Office Action from U.S. Appl. No. 12/111,828 Mailed Apr. 17, 2009.
Non-Final Office Action from U.S. Appl. No. 12/203,100 Dated Dec. 1, 2010.
Non-Final Office Action from U.S. Appl. No. 12/378,328 Dated Jul. 15, 2011.
Non-Final Office Action from U.S. Appl. No. 12/507,682 Mailed Mar. 8, 2010.
Non-Final Office Action from U.S. Appl. No. 12/574,628 Dated Sep. 20, 2011.

(56) References Cited

OTHER PUBLICATIONS

Non-Final Office Action from U.S. Appl. No. 12/769,428 Dated Nov. 8, 2010.
Non-Final Office Action from U.S. Appl. No. 12/797,557 Dated Jun. 21, 2011.
Non-Final Office Action from U.S. Appl. No. 12/816,756 Dated Feb. 7, 2011.
Non-Final Office Action from U.S. Appl. No. 12/838,896 Dated Sep. 3, 2010.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowability from U.S. Appl. No. 11/855,826 Dated Aug. 15, 2011.
Notice of Allowance from U.S. Appl. No. 11/461,430 Dated Sep. 10, 2009.
Notice of Allowance from U.S. Appl. No. 11/461,437 Dated Jul. 25, 2011.
Notice of Allowance from U.S. Appl. No. 11/515,223 Dated Feb. 4, 2011.
Notice of Allowance from U.S. Appl. No. 11/553,372 Dated Sep. 30, 2009.
Notice of Allowance from U.S. Appl. No. 11/553,372 Dated Aug. 4, 2010.
Notice of Allowance from U.S. Appl. No. 11/553,399 Dated Oct. 13, 2009.
Notice of Allowance from U.S. Appl. No. 11/553,399 Dated Dec. 3, 2010.
Notice of Allowance from U.S. Appl. No. 11/553,399 Dated Mar. 18, 2011.
Notice of Allowance from U.S. Appl. No. 11/611,374 Dated Sep. 15, 2009.
Notice of Allowance from U.S. Appl. No. 11/611,374 Dated Oct. 29, 2010.
Notice of Allowance from U.S. Appl. No. 11/611,374 Dated Mar. 4, 2011.
Notice of Allowance from U.S. Appl. No. 11/611,374 Dated Jun. 24, 2011.
Notice of Allowance from U.S. Appl. No. 11/611,374 Mailed Nov. 30, 2009.
Notice of Allowance from U.S. Appl. No. 11/702,981 Dated Apr. 25, 2011.
Notice of Allowance from U.S. Appl. No. 11/702,981 Dated Aug. 5, 2011.
Notice of Allowance from U.S. Appl. No. 11/762,010 Dated Oct. 22, 2010.
Notice of Allowance from U.S. Appl. No. 11/762,010 Dated Feb. 18, 2011.
Notice of Allowance from U.S. Appl. No. 11/762,010 Dated Jun. 8, 2011.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/762,013 Dated Feb. 22, 2011.
Notice of Allowance from U.S. Appl. No. 11/762,013 Dated Jun. 20, 2011.
Notice of Allowance from U.S. Appl. No. 11/763,365 Dated Oct. 20, 2010.
Notice of Allowance from U.S. Appl. No. 11/763,365 Dated Mar. 1, 2011.
Notice of Allowance from U.S. Appl. No. 11/763,365 Dated Jun. 24, 2011.
Notice of Allowance from U.S. Appl. No. 11/929,320 Dated Sep. 29, 2010.
Notice of Allowance from U.S. Appl. No. 11/929,320 Dated May 5, 2011.
Notice of Allowance from U.S. Appl. No. 11/929,483 Dated Oct. 7, 2010.
Notice of Allowance from U.S. Appl. No. 11/929,483 Dated Mar. 4, 2011.
Notice of Allowance from U.S. Appl. No. 11/929,483 Dated Jun. 23, 2011.
Notice of Allowance from U.S. Appl. No. 11/929,500 Dated Feb. 24, 2011.
Notice of Allowance from U.S. Appl. No. 11/929,500 Dated Jun. 13, 2011.
Notice of Allowance from U.S. Appl. No. 11/929,500 Dated Sep. 27, 2011.
Notice of Allowance from U.S. Appl. No. 11/929,571 Dated Sep. 27, 2011.
Notice of Allowance from U.S. Appl. No. 11/939,432 Dated Sep. 24, 2009.
Notice of Allowance from U.S. Appl. No. 11/939,432 Dated Feb. 18, 2011.
Notice of Allowance from U.S. Appl. No. 11/939,432 Mailed Dec. 1, 2009.
Notice of Allowance from U.S. Appl. No. 11/941,589 Dated Oct. 25, 2010.
Notice of Allowance from U.S. Appl. No. 11/941,589 Dated Jun. 15, 2011.
Notice of Allowance from U.S. Appl. No. 11/941,589 Dated Sep. 30, 2011.
Notice of Allowance from U.S. Appl. No. 12/111,819 Mailed Nov. 20, 2009.
Notice of Allowance from U.S. Appl. No. 12/111,828 Mailed Dec. 15, 2009.
Notice of Allowance from U.S. Appl. No. 12/144,396 Dated Feb. 1, 2011.
Notice of Allowance from U.S. Appl. No. 12/203,100 Dated Jun. 17, 2011.
Notice of Allowance from U.S. Appl. No. 12/816,756 Dated Oct. 3, 2011.
Notice of Allowance from U.S. Appl. No. 12/838,896 Dated Apr. 19, 2011.
Office Action from U.S. Appl. No. 12/754,628 Dated Jun. 10, 2010.
Search Report and Written Opinion From PCT Application No. PCT/US07/03460 Dated Feb. 14, 2008.
Search Report From PCT Application No. PCT/US10/038041 Dated Aug. 23, 2010.
Supplemental European Search Report and Search Opinion issued Sep. 21, 2009 in European Application No. 07870726.2, 8 pp.
Fang et al., W. Power Complexity Analysis of Adiabatic SRAM, 6th Int. Conference on ASIC, vol. 1, Oct. 2005, pp. 334-337.
Kellerbauer "Die Schnelle Million," with translation, "The quick million," [online] [Retrieved on Apr. 1, 2008]; Retrieved from the Internet URL: http://et.coremelt.net/html/91/12/276/art.htm: 8 pages.
Notice of Allowance from U.S. Appl. No. 11/515,223 Dated Jul. 30, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Notice of Allowance from U.S. Appl. No. 11/611,374 Dated Jul. 19, 2010.
Notice of Allowance from U.S. Appl. No. 11/611,374 Mailed Apr. 5, 2010.
Notice of Allowance from U.S. Appl. No. 11/762,010 Dated Jul. 2, 2010.
Notice of Allowance from U.S. Appl. No. 11/763,365 Dated Jun. 29, 2010.
Notice of Allowance from U.S. Appl. No. 12/111,819 Mailed Mar. 10, 2010.

(56) References Cited

OTHER PUBLICATIONS

Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.

Wu et al., "eNVy: A Non-Volatile, Main Memory Storage System", Rice University, ASPLOS-VI Proceedings—Sixth International Conference on Architectural Support for Programming Languages and Operating Systems, San Jose, California, Oct. 4-7, 1994. SIGARCH Computer Architecture News 22(Special Issue Oct. 1994) pp. 86-97; downloaded Nov. 1994.

Non-Final Office Action from U.S. Appl. No. 12/508,496 Dated Oct. 11, 2011.

Non-Final Office Action from U.S. Appl. No. 11/588,739 Dated Oct. 13, 2011.

Notice of Allowance from U.S. Appl. No. 11/939,432 Dated Oct. 24, 2011.

Non-Final Office Action from U.S. Appl. No. 11/929,631 Dated Nov. 1, 2011.

Non-Final Office Action from U.S. Appl. No. 11/553,372 Dated Nov. 14, 2011.

Notice of Allowance from U.S. Appl. No. 11/515,223 Dated Nov. 29, 2011.

Notice of Allowance from U.S. Appl. No. 12/769,428 Dated Nov. 28, 2011.

Final Office Action from U.S. Appl. No. 11/939,440 Dated Dec. 12, 2011.

Notice of Allowance from U.S. Appl. No. 12/797,557 Dated Dec. 28, 2011.

Office Action, including English translation, from related Japanese application No. 2008-529353, Dated Jan. 10, 2012.

Notice of Allowance from U.S. Appl. No. 12/838,896 Dated Jan. 18, 2012.

Final Office Action from U.S. Appl. No. 11/929,655 Dated Jan. 19, 2012.

Final Office Action from U.S. Appl. No. 12/378,328 Dated Feb. 3, 2012.

Final Office Action from U.S. Appl. No. 11/672,921 Dated Feb. 16, 2012.

Final Office Action from U.S. Appl. No. 11/672,924 Dated Feb. 16, 2012.

Final Office Action from U.S. Appl. No. 11/929,225 Dated Feb. 16, 2012.

Copy of International Search Report for Application No. EP12150807 Dated Feb. 16, 2012.

Final Office Action from U.S. Appl. No. 11/828,181 Dated Feb. 23, 2012.

Non-Final Office Action from U.S. Appl. No. 11/461,520 Dated Feb. 29, 2012.

Non-Final Office Action from U.S. Appl. No. 13/276,212 Dated Mar. 15, 2012.

Non-Final Office Action from U.S. Appl. No. 13/343,612 Dated Mar. 29, 2012.

Notice of Allowance from U.S. Appl. No. 11/939,440 Dated Mar. 30, 2012.

European Search Report from related European application No. 11194876.6-2212/2450798, Dated Apr. 12, 2012.

European Search Report from related European application No. 11194862.6-2212/2450800, Dated Apr. 12, 2012.

Notice of Allowance from Application No. 11/929,636, Dated Apr. 17, 2012.

Final Office Action from U.S. Appl. No. 11/858,518, Dated Apr. 17, 2012.

Notice of Allowance from U.S. Appl. No. 12/574,628, Dated Mar. 6, 2012.

European Search Report from co-pending European application No. 11194883.2-2212, Dated Apr. 27, 2012.

Non-Final Office Action from U.S. Appl. No. 11/553,372, Dated May 3, 2012.

Notice of Allowance from U.S. Appl. No. 11/929,631, Dated May 3, 2012.

Office Action, including English translation, from co-pending Japanese application No. 2008-529353, Dated Jul. 31, 2012.

Final Office Action from U.S. Appl. No. 13/276,212, Dated Aug. 30, 2012.

Non-Final Office Action from U.S. Appl. No. 13/367,182, Dated Aug. 31, 2012.

Notice of Allowance from U.S. Appl. No. 11/461,420, Dated Sep. 5, 2012.

Final Office Action from U.S. Appl. No. 13/280,251, Dated Sep. 12, 2012.

Non-Final Office Action from U.S. Appl. No. 11/929,225, Dated Sep. 17, 2012.

Notice of Allowance from U.S. Appl. No. 12/508,496, Dated Sep. 17, 2012.

Non-Final Office Action from U.S. Appl. No. 11/672,921, Dated Oct. 1, 2012.

Notice of Allowance from U.S. Appl. No. 12/057,306, Dated Oct. 10, 2012.

Notice Allowance from U.S. Appl. No. 12/144,396, Dated Oct. 11, 2012.

Non-Final Office Action from U.S. Appl. No. 13/411,489, Dated Oct. 17, 2012.

Non-Final Office Action from U.S. Appl. No. 13/471,283, Dated Dec. 7, 2012.

English translation of Office Action from co-pending Korean patent application No. KR1020087005172, dated Dec. 20, 2012.

Office Action, including English translation, from co-pending Japanese application No. 2008-529353, Dated Dec. 27, 2012.

Office Action from co-pending European patent application No. EP12150798, Dated Jan. 3, 2013.

Final Office Action from U.S. Appl. No. 11/672,924, Dated Feb. 1, 2013.

Non-Final Office Action from U.S. Appl. No. 13/260,650, Dated Feb. 1, 2013.

Notice of Allowance from U.S. Appl. No. 13/615,008, dated Dec. 3, 2013.

Notice of Allowance from U.S. Appl. No. 13/620,425, dated Dec. 11, 2013.

English Translation of Office Action from co-pending Japanese patent application No. P2012-197675, Dec. 3, 2013.

English Translation of Office Action from co-pending Japanese patent application No. P2012-197678, Dec. 3, 2013.

Notice of Allowance from U.S. Appl. No. 13/455,691, dated Dec. 31, 2013.

Non-Final Office Action from U.S. Appl. No. 11/553,390, dated Dec. 31, 2013.

English Translation of Office Action from co-pending Korean patent application No. 10-2013-7004006, dated Dec. 26, 2013.

Search Report from co-pending European Patent Application No. 13191794, dated Dec. 12, 2013.

Notice of Allowance from U.S. Appl. No. 13/620,425, dated Jan. 13, 2014.

Notice of Allowance from U.S. Appl. No. 13/141,844, Dated Feb. 5, 2013.

Notice of Allowance from U.S. Appl. No. 13/473,827, Dated Feb. 15, 2013.

Notice of Allowance from U.S. Appl. No. 12/378,328, Dated Feb. 27, 2013.

Non-Final Office Action from U.S. Appl. No. 13/536,093, Dated Mar. 1, 2013.

Office Action from co-pending Japanese patent application No. 2012-132119, Dated Mar. 6, 2013.

Notice of Allowance from U.S. Appl. No. 11/461,435, Dated Mar. 6, 2013.

Notice of Allowance from U.S. Appl. No. 11/515,223, Dated Mar. 18, 2013.

Notice of Allowance from U.S. Appl. No. 13/471,283, Dated Mar. 21, 2013.

Extended European Search Report for co-pending European patent application No. EP12150807.1, dated Feb. 1, 2013, mailed Mar. 22, 2013.

(56) References Cited

OTHER PUBLICATIONS

Notice of Allowance from U.S. Appl. No. 13/181,716, Dated Apr. 3, 2013.
English translation of Office Action from co-pending Korean patent application No. KR1020087019582, Dated Mar. 13, 2013.
English Translation of Office Action from co-pending Korean patent application No. 10-2013-7004006, Dated Apr. 12, 2013.
Notice of Allowance from U.S. Appl. No. 13/618,246, Dated Apr. 23, 2013.
Notice of Allowance from U.S. Appl. No. 13/182,234, Dated May 1, 2013.
EPO Communication for Co-pending European patent application No. EP11194862.6, dated May 5, 2013.
Non-Final Office Action from U.S. Appl. No. 13/620,793, Dated May 6, 2013.
Non-Final Office Action from U.S. Appl. No. 13/620,565, Dated May 24, 2013.
Final Office Action from U.S. Appl. No. 11/929,225, Dated May 24, 2013.
Final Office Action from U.S. Appl. No. 11/672,921, Dated May 24, 2013.
Notice of Allowance from U.S. Appl. No. 11/929,631, Dated May 28, 2013.
Notice of Allowance from U.S. Appl. No. 13/620,424, Dated May 29, 2013.
Notice of Allowance from U.S. Appl. No. 13/341,844, Dated May 30, 2013.
Non-Final Office Action from U.S. Appl. No. 13/455,691, Dated Jun. 4, 2013.
Non-Final Office Action from U.S. Appl. No. 13/620,199, Dated Jun. 17, 2013.
Non-Final Office Action from U.S. Appl. No. 13/620,207, Dated Jun. 20, 2013.
Non-Final Office Action from U.S. Appl. No. 11/828,182, Dated Jun. 20, 2013.
Final Office Action from U.S. Appl. No. 11/828,181, Dated Jun. 20, 2013.
Non-Final Office Action from U.S. Appl. No. 11/929,655, Dated Jun. 21, 2013.
Notice of Allowance from U.S. Appl. No. 13/597,895, Dated Jun. 25, 2013.
Non-Final Office Action from U.S. Appl. No. 13/620,645, Dated Jun. 26, 2013.
Notice of Allowance from U.S. Appl. No. 13/471,283, Dated Jun. 28, 2013.
Notice of Allowance from U.S. Appl. No. 13/181,747, Dated Jul. 9, 2013.
Notice of Allowance from U.S. Appl. No. 11/515,223, Dated Jul. 18, 2013.
Notice of Allowance from U.S. Appl. No. 13/182,234, Dated Jul. 22, 2013.
Notice of Allowance from U.S. Appl. No. 13/181,716, Dated Jul. 22, 2013.
Non-Final Office Action from U.S. Appl. No. 13/620,233, Dated Aug. 2, 2013.
Final Office Action from U.S. Appl. No. 13/367,182, Dated Aug. 8, 2013.
Notice of Allowance from U.S. Appl. No. 13/615,008, Dated Aug. 15, 2013.
Notice of Allowance from U.S. Appl. No. 13/620,425, Dated Aug. 20, 2013.
Non-Final Office Action from U.S. Appl. No. 13/620,601, Dated Aug. 23, 2013.
Non-Final Office Action from U.S. Appl. No. 12/507,683, Dated Aug. 27, 2013.
Final Office Action from U.S. Appl. No. 13/620,650, Dated Aug. 30, 2013.
Notice of Allowance from U.S. Appl. No. 13/620,424, Dated Sep. 11, 2013.
Non-Final Office Action from U.S. Appl. No. 13/620,291, Dated Sep. 12, 2013.
Notice of Allowance from U.S. Appl. No. 13/341,844, Dated Sep. 17, 2013.
Notice of Allowance from U.S. Appl. No. 13/620,412, dated Sep. 25, 2013.
Non-Final Office Action from U.S. Appl. No. 13/343,852, dated Sep. 27, 2013.
English Translation of Office Action from co-pending Korean patent application No. 10-2008-7019582, dated Sep. 16, 2013.
Notice of Allowance from U.S. Appl. No. 13/620,565, dated Sep. 27, 2013.
Non-Final Office Action from U.S. Appl. No. 13/279,068, dated Sep. 30, 2013.
Notice of Allowance from U.S. Appl. No. 13/620,207, dated Oct. 9, 2013.
Non-Final Office Action from U.S. Appl. No. 13/898,002, dated Oct. 10, 2013.
Notice of Allowance from U.S. Appl. No. 13/471,283, dated Oct. 15, 2013.
Notice of Allowance from U.S. Appl. No. 11/515,223, dated Oct. 24, 2013.
Notice of Allowance from U.S. Appl. No. 13/181,747, dated Oct. 28, 2013.
Notice of Allowance from U.S. Appl. No. 13/597,895, dated Oct. 29, 2013.
Notice of Allowance from U.S. Appl. No. 13/620,199, dated Nov. 13, 2013.
Final Office Action from U.S. Appl. No. 13/620,793, dated Nov. 13, 2013.
Notice of Allowance from U.S. Appl. No. 13/618,246, dated Nov. 14, 2013.
Notice of Allowance from U.S. Appl. No. 13/473,827, dated Nov. 20, 2013.

\* cited by examiner

MEMORY REFRESH APPARATUS AND METHOD

CROSS-REFERENCE TO RELATED APPLICATIONS

This is a continuation of U.S. application Ser. No. 11/461,437 filed Jul. 31, 2006 now U.S. Pat. No. 8,077,535, which is a continuation-in-part of U.S. application Ser. No. 11/474,075, filed Jun. 23, 2006 now U.S. Pat. No. 7,515,453, which claims the benefit of U.S. Provisional Application No. 60/693,631 filed Jun. 24, 2005. All subject matter set forth in the above referenced applications are hereby incorporated by reference into the present application as if fully set forth herein.

FIELD OF THE INVENTION

The present invention relates to memory, and more particularly to multiple-memory circuit systems.

BACKGROUND

The memory capacity requirements of computers in general, and servers in particular, are increasing rapidly due to various trends such as 64-bit processors and operating systems, multi-core processors, virtualization, etc. However, other industry trends such as higher memory bus speeds and small form factor machines, etc. are reducing the number of memory module slots in such systems. Thus, a need exists in the industry for large capacity memory circuits to be used in such systems.

However, there is also an exponential relationship between a capacity of monolithic memory circuits and a price associated therewith. As a result, large capacity memory modules may be cost prohibitive. To this end, the use of multiple smaller capacity memory circuits is a cost-effective approach to increasing such memory capacity.

SUMMARY

An apparatus and method are provided. In response to the receipt of a refresh control signal, a plurality of refresh control signals is sent to the memory circuits at different times.

DETAILED DESCRIPTION

Figure 1:
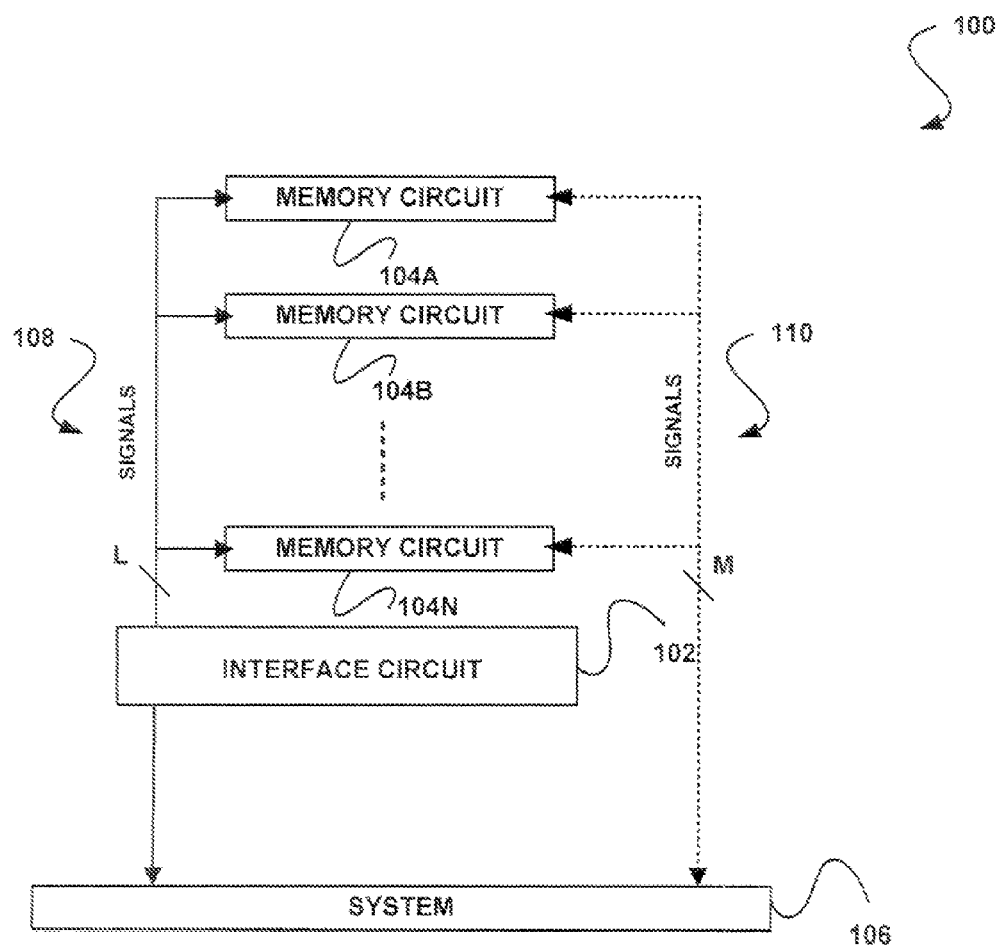
FIG. 1 illustrates a multiple memory circuit framework, in accordance with one embodiment.

FIG. 1 illustrates a multiple memory circuit framework 100, in accordance with one embodiment. As shown, included are an interface circuit 102, a plurality of memory circuits 104A, 104B, 104N, and a system 106. In the context of the present description, such memory circuits 104A, 104B, 104N may include any circuit capable of serving as memory.

For example, in various embodiments, one or more of the memory circuits 104A, 104B, 104N may include a monolithic memory circuit. For instance, such monolithic memory circuit may take the form of dynamic random access memory (DRAM). Such DRAM may take any form including, but not limited to synchronous (SDRAM), double data rate synchronous (DDR DRAM, DDR2 DRAM, DDR3 DRAM, etc.), quad data rate (QDR DRAM), direct RAMBUS (DRDRAM), fast page mode (FPM DRAM), video (VDRAM), extended data out (EDO DRAM), burst EDO (BEDO DRAM), multi-bank (MDRAM), synchronous graphics (SGRAM), and/or any other type of DRAM. Of course, one or more of the memory circuits 104A, 104B, 104N may include other types of memory such as magnetic random access memory (MRAM), intelligent random access memory (IRAM), distributed network architecture (DNA) memory, window random access memory (WRAM), flash memory (e.g. NAND, NOR, or others, etc.), pseudostatic random access memory (PSRAM), wetware memory, and/or any other type of memory circuit that meets the above definition.

In additional embodiments, the memory circuits 104A, 104B, 104N may be symmetrical or asymmetrical. For example, in one embodiment, the memory circuits 104A, 104B, 104N may be of the same type, brand, and/or size, etc. Of course, in other embodiments, one or more of the memory circuits 104A, 104B, 104N may be of a first type, brand, and/or size; while one or more other memory circuits 104A, 104B, 104N may be of a second type, brand, and/or size, etc. Just by way of example, one or more memory circuits 104A, 104B, 104N may be of a DRAM type, while one or more other memory circuits 104A, 104B, 104N may be of a flash type. While three or more memory circuits 104A, 104B, 104N are shown in FIG. 1 in accordance with one embodiment, it should be noted that any plurality of memory circuits 104A, 104B, 104N may be employed.

Strictly as an option, the memory circuits 104A, 104B, 104N may or may not be positioned on at least one dual in-line memory module (DIMM) (not shown). In various embodiments, the DIMM may include a registered DIMM (R-DIMM), a small outline-DIMM (SO-DIMM), a fully buffered-DIMM (FB-DIMM), an un-buffered DIMM, etc. Of course, in other embodiments, the memory circuits 104A, 104B, 104N may or may not be positioned on any desired entity for packaging purposes.

Further in the context of the present description, the system 106 may include any system capable of requesting and/or initiating a process that results in an access of the memory circuits 104A, 104B, 104N. As an option, the system 106 may accomplish this utilizing a memory controller (not shown), or any other desired mechanism. In one embodiment, such system 106 may include a host system in the form of a desktop computer, lap-top computer, server, workstation, a personal digital assistant (PDA) device, a mobile phone device, a television, a peripheral device (e.g. printer, etc.). Of course, such examples are set forth for illustrative purposes only, as any system meeting the above definition may be employed in the context of the present framework 100.

Turning now to the interface circuit 102, such interface circuit 102 may include any circuit capable of indirectly or directly communicating with the memory circuits 104A, 104B, 104N and the system 106. In various optional embodiments, the interface circuit 102 may include one or more interface circuits, a buffer chip, etc. Embodiments involving such a buffer chip will be set forth hereinafter during reference to subsequent figures. In still other embodiments, the interface circuit 102 may or may not be manufactured in monolithic form.

While the memory circuits 104A, 104B, 104N, interface circuit 102, and system 106 are shown to be separate parts, it is contemplated that any of such parts (or portions thereof) may or may not be integrated in any desired manner. In various embodiments, such optional integration may involve simply packaging such parts together (e.g. stacking the parts, etc.) and/or integrating them monolithically. Just by way of example, in various optional embodiments, one or more portions (or all, for that matter) of the interface circuit 102 may or may not be packaged with one or more of the memory circuits 104A, 104B, 104N (or all, for that matter). Different optional embodiments which may be implemented in accordance with the present multiple memory circuit framework 100 will be set forth hereinafter during reference to FIGS. 2A-2E, and 3 et al.

In use, the interface circuit 102 may be capable of various functionality, in the context of different embodiments. More illustrative information will now be set forth regarding such optional functionality which may or may not be implemented in the context of such interface circuit 102, per the desires of the user. It should be strongly noted that the following information is set forth for illustrative purposes and should not be construed as limiting in any manner. For example, any of the following features may be optionally incorporated with or without the exclusion of other features described.

For instance, in one optional embodiment, the interface circuit 102 interfaces a plurality of signals 108 that are communicated between the memory circuits 104A, 104B, 104N and the system 106. As shown, such signals may, for example, include address/control/clock signals, etc. In one aspect of the present embodiment, the interfaced signals 108 may represent all of the signals that are communicated between the memory circuits 104A, 104B, 104N and the system 106. In other aspects, at least a portion of signals 110 may travel directly between the memory circuits 104A, 104B, 104N and the system 106 or component thereof [e.g. register, advanced memory buffer (AMB), memory controller, or any other component thereof, where the term component is defined hereinbelow]. In various embodiments, the number of the signals 108 (vs. a number of the signals 110, etc.) may vary such that the signals 108 are a majority or more (L>M), etc.

In yet another embodiment, the interface circuit 102 may be operable to interface a first number of memory circuits 104A, 104B, 104N and the system 106 for simulating at least one memory circuit of a second number. In the context of the present description, the simulation may refer to any simulating, emulating, disguising, transforming, converting, and/or the like that results in at least one aspect (e.g. a number in this embodiment, etc.) of the memory circuits 104A, 104B, 104N appearing different to the system 106. In different embodiments, the simulation may be electrical in nature, logical in nature, protocol in nature, and/or performed in any other desired manner. For instance, in the context of electrical simulation, a number of pins, wires, signals, etc. may be simulated, while, in the context of logical simulation, a particular function may be simulated. In the context of protocol, a particular protocol (e.g. DDR3, etc.) may be simulated.

In still additional aspects of the present embodiment, the second number may be more or less than the first number. Still yet, in the latter case, the second number may be one, such that a single memory circuit is simulated. Different optional embodiments which may employ various aspects of the present embodiment will be set forth hereinafter during reference to FIGS. 2A-2E, and 3 et al.

In still yet another embodiment, the interface circuit 102 may be operable to interface the memory circuits 104A, 104B, 104N and the system 106 for simulating at least one memory circuit with at least one aspect that is different from at least one aspect of at least one of the plurality of the memory circuits 104A, 104B, 104N. In accordance with various aspects of such embodiment, such aspect may include a signal, a capacity, a timing, a logical interface, etc. Of course, such examples of aspects are set forth for illustrative purposes only and thus should not be construed as limiting, since any aspect associated with one or more of the memory circuits 104A, 104B, 104N may be simulated differently in the foregoing manner.

In the case of the signal, such signal may refer to a control signal (e.g. an address signal; a signal associated with an activate operation, precharge operation, write operation, read operation, a mode register write operation, a mode register read operation, a refresh operation; etc.), a data signal, a logical or physical signal, or any other signal for that matter. For instance, a number of the aforementioned signals may be simulated to appear as fewer or more signals, or even simulated to correspond to a different type. In still other embodiments, multiple signals may be combined to simulate another signal. Even still, a length of time in which a signal is asserted may be simulated to be different.

In the case of protocol, such may, in one exemplary embodiment, refer to a particular standard protocol. For example, a number of memory circuits 104A, 104B, 104N that obey a standard protocol (e.g. DDR2, etc.) may be used to simulate one or more memory circuits that obey a different protocol (e.g. DDR3, etc.). Also, a number of memory circuits 104A, 104B, 104N that obey a version of protocol (e.g. DDR2 with 3-3-3 latency timing, etc.) may be used to simulate one or more memory circuits that obey a different version of the same protocol (e.g. DDR2 with 5-5-5 latency timing, etc.).

In the case of capacity, such may refer to a memory capacity (which may or may not be a function of a number of the memory circuits 104A, 104B, 104N; see previous embodiment). For example, the interface circuit 102 may be operable for simulating at least one memory circuit with a first memory capacity that is greater than (or less than) a second memory capacity of at least one of the memory circuits 104A, 104B, 104N.

In the case where the aspect is timing-related, the timing may possibly relate to a latency (e.g. time delay, etc.). In one aspect of the present embodiment, such latency may include a column address strobe (CAS) latency, which refers to a latency associated with accessing a column of data. Still yet, the latency may include a row address to column address latency (tRCD), which refers to a latency required between the row address strobe (RAS) and CAS. Even still, the latency may include a row precharge latency (tRP), which refers a latency required to terminate access to an open row, and open access to a next row. Further, the latency may include an activate to precharge latency (tRAS), which refers to a latency required to access a certain row of data between an activate operation and a precharge operation. In any case, the interface circuit 102 may be operable for simulating at least one memory circuit with a first latency that is longer (or shorter) than a second latency of at least one of the memory circuits 104A, 104B, 104N. Different optional embodiments which employ various features of the present embodiment will be set forth hereinafter during reference to FIGS. 2A-2E, and 3 et al.

In still another embodiment, a component may be operable to receive a signal from the system 106 and communicate the signal to at least one of the memory circuits 104A, 104B, 104N after a delay. Again, the signal may refer to a control signal (e.g. an address signal; a signal associated with an activate operation, precharge operation, write operation, read operation; etc.), a data signal, a logical or physical signal, or any other signal for that matter. In various embodiments, such delay may be fixed or variable (e.g. a function of the current signal, the previous signal, etc.). In still other embodiments, the component may be operable to receive a signal from at least one of the memory circuits 104A, 104B, 104N and communicate the signal to the system 106 after a delay.

As an option, the delay may include a cumulative delay associated with any one or more of the aforementioned signals. Even still, the delay may result in a time shift of the signal forward and/or back in time (with respect to other signals). Of course, such forward and backward time shift may or may not be equal in magnitude. In one embodiment, this time shifting may be accomplished by utilizing a plurality of delay functions which each apply a different delay to a different signal. In still additional embodiments, the aforementioned shifting may be coordinated among multiple signals such that different signals are subject to shifts with different relative directions/magnitudes, in an organized fashion.

Further, it should be noted that the aforementioned component may, but need not necessarily take the form of the interface circuit 102 of FIG. 1. For example, the component may include a register, an AMB, a component positioned on at least one DIMM, a memory controller, etc. Such register may, in various embodiments, include a Joint Electron Device Engineering Council (JEDEC) register, a JEDEC register including one or more functions set forth herein, a register with forwarding, storing, and/or buffering capabilities, etc. Different optional embodiments which employ various features of the present embodiment will be set forth hereinafter during reference to FIGS. 4-7, and 9A-B et al.

In a power-saving embodiment, at least one of a plurality of memory circuits 104A, 104B, 104N may be identified that is not currently being accessed by the system 106. In one embodiment, such identification may involve determining whether a page [i.e. any portion of any memory(s), etc.] is being accessed in at least one of the plurality of memory circuits 104A, 104B, 104N. Of course, any other technique may be used that results in the identification of at least one of the memory circuits 104A, 104B, 104N that is not being accessed.

In response to the identification of the at least one memory circuit 104A, 104B, 104N, a power saving operation is initiated in association with the at least one memory circuit 104A, 104B, 104N. In one optional embodiment, such power saving operation may involve a power down operation and, in particular, a precharge power down operation. Of course, however, it should be noted that any operation that results in at least some power savings may be employed in the context of the present embodiment.

Similar to one or more of the previous embodiments, the present functionality or a portion thereof may be carried out utilizing any desired component. For example, such component may, but need not necessarily take the form of the interface circuit 102 of FIG. 1. In other embodiments, the component may include a register, an AMB, a component positioned on at least one DIMM, a memory controller, etc. One optional embodiment which employs various features of the present embodiment will be set forth hereinafter during reference to FIG. 10.

In still yet another embodiment, a plurality of the aforementioned components may serve, in combination, to interface the memory circuits 104A, 104B, 104N and the system 106. In various embodiments, two, three, four, or more components may accomplish this. Also, the different components may be relatively configured in any desired manner. For example, the components may be configured in parallel, serially, or a combination thereof. In addition, any number of the components may be allocated to any number of the memory circuits 104A, 104B, 104N.

Further, in the present embodiment, each of the plurality of components may be the same or different. Still yet, the components may share the same or similar interface tasks and/or perform different interface tasks. Such interface tasks may include, but are not limited to simulating one or more aspects of a memory circuit, performing a power savings/refresh operation, carrying out any one or more of the various functionalities set forth herein, and/or any other task relevant to the aforementioned interfacing. One optional embodiment which employs various features of the present embodiment will be set forth hereinafter during reference to FIG. 3.

Additional illustrative information will now be set forth regarding various optional embodiments in which the foregoing techniques may or may not be implemented, per the desires of the user. For example, an embodiment is set forth for storing at least a portion of information received in association with a first operation for use in performing a second operation. See FIG. 2F. Further, a technique is provided for refreshing a plurality of memory circuits, in accordance with still yet another embodiment. See FIG. 11.

It should again be strongly noted that the following information is set forth for illustrative purposes and should not be construed as limiting in any manner. Any of the following features may be optionally incorporated with or without the exclusion of other features described.

FIGS. 2A-2E show various configurations of a buffered stack of DRAM circuits 206A-D with a buffer chip 202, in accordance with various embodiments. As an option, the various configurations to be described in the following embodiments may be implemented in the context of the architecture and/or environment of FIG. 1. Of course, however, they may also be carried out in any other desired environment (e.g. using other memory types, etc.). It should also be noted that the aforementioned definitions may apply during the present description.

As shown in each of such figures, the buffer chip 202 is placed electrically between an electronic host system 204 and a stack of DRAM circuits 206A-D. In the context of the present description, a stack may refer to any collection of memory circuits. Further, the buffer chip 202 may include any device capable of buffering a stack of circuits (e.g. DRAM circuits 206A-D, etc.). Specifically, the buffer chip 202 may be capable of buffering the stack of DRAM circuits 206A-D to electrically and/or logically resemble at least one larger capacity DRAM circuit to the host system 204. In this way, the stack of DRAM circuits 206A-D may appear as a smaller quantity of larger capacity DRAM circuits to the host system 204.

For example, the stack of DRAM circuits 206A-D may include eight 512 Mb DRAM circuits. Thus, the buffer chip 202 may buffer the stack of eight 512 Mb DRAM circuits to resemble a single 4 Gb DRAM circuit to a memory controller (not shown) of the associated host system 204. In another example, the buffer chip 202 may buffer the stack of eight 512 Mb DRAM circuits to resemble two 2 Gb DRAM circuits to a memory controller of an associated host system 204.

Further, the stack of DRAM circuits 206A-D may include any number of DRAM circuits. Just by way of example, a buffer chip 202 may be connected to 2, 4, 8 or more DRAM circuits 206A-D. Also, the DRAM circuits 206A-D may be arranged in a single stack, as shown in FIGS. 2A-2D.

The DRAM circuits 206A-D may be arranged on a single side of the buffer chip 202, as shown in FIGS. 2A-2D. Of course, however, the DRAM circuits 206A-D may be located on both sides of the buffer chip 202 shown in FIG. 2E. Thus, for example, a buffer chip 202 may be connected to 16 DRAM circuits with 8 DRAM circuits on either side of the buffer chip 202, where the 8 DRAM circuits on each side of the buffer chip 202 are arranged in two stacks of four DRAM circuits.

The buffer chip 202 may optionally be a part of the stack of DRAM circuits 206A-D. Of course, however, the buffer chip 202 may also be separate from the stack of DRAM circuits 206A-D. In addition, the buffer chip 202 may be physically located anywhere in the stack of DRAM circuits 206A-D, where such buffer chip 202 electrically sits between the electronic host system 204 and the stack of DRAM circuits 206A-D.

In one embodiment, a memory bus (not shown) may connect to the buffer chip 202, and the buffer chip 202 may connect to each of the DRAM circuits 206A-D in the stack. As shown in FIGS. 2A-2D, the buffer chip 202 may be located at the bottom of the stack of DRAM circuits 206A-D (e.g. the bottom-most device in the stack). As another option, and as shown in FIG. 2E, the buffer chip 202 may be located in the middle of the stack of DRAM circuits 206A-D. As still yet another option, the buffer chip 202 may be located at the top of the stack of DRAM circuits 206A-D (e.g. the top-most device in the stack). Of course, however, the buffer chip 202 may be located anywhere between the two extremities of the stack of DRAM circuits 206A-D.

The electrical connections between the buffer chip 202 and the stack of DRAM circuits 206A-D may be configured in any desired manner. In one optional embodiment; address, control (e.g. command, etc.), and clock signals may be common to all DRAM circuits 206A-D in the stack (e.g. using one common bus). As another option, there may be multiple address, control and clock busses. As yet another option, there may be individual address, control and clock busses to each DRAM circuit 206A-D. Similarly, data signals may be wired as one common bus, several busses or as an individual bus to each DRAM circuit 206A-D. Of course, it should be noted that any combinations of such configurations may also be utilized.

Figure 2A:
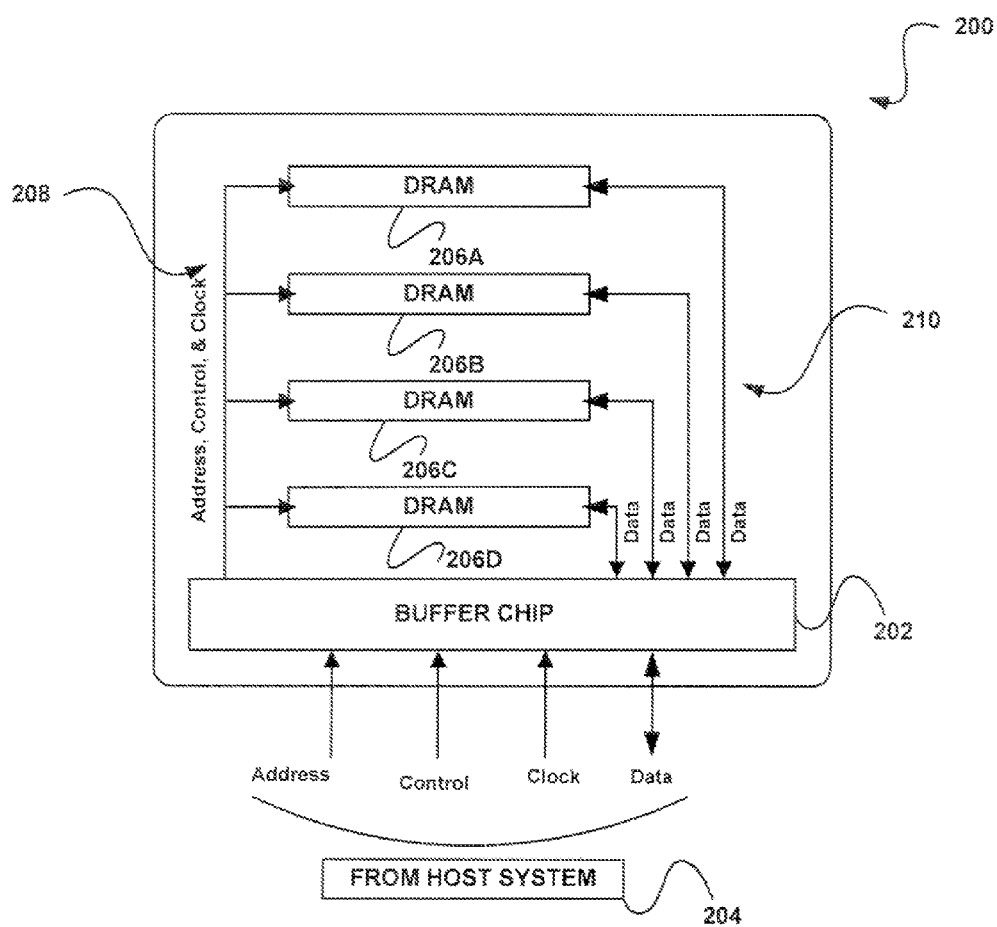
FIGS. 2A-2E show various configurations of a buffered stack of dynamic random access memory (DRAM) circuits with a buffer chip, in accordance with various embodiments.
Figure 2B:
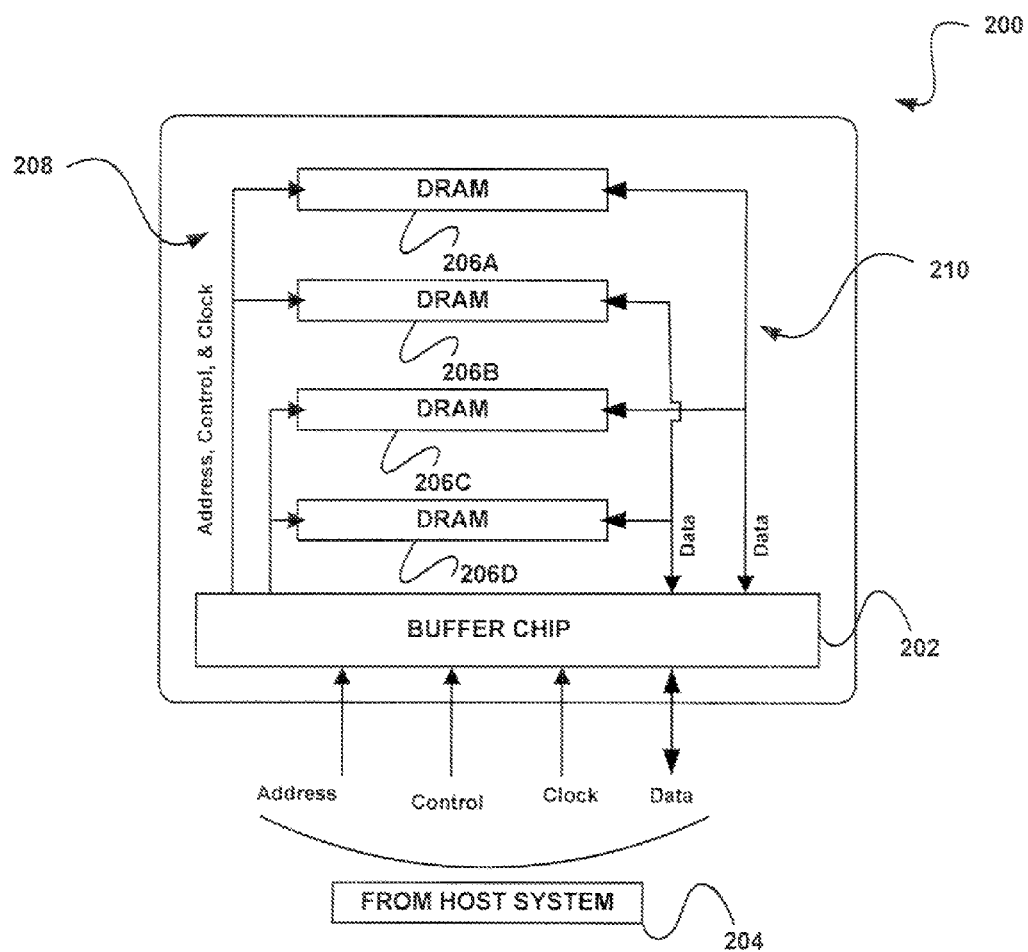
Figure 2C:
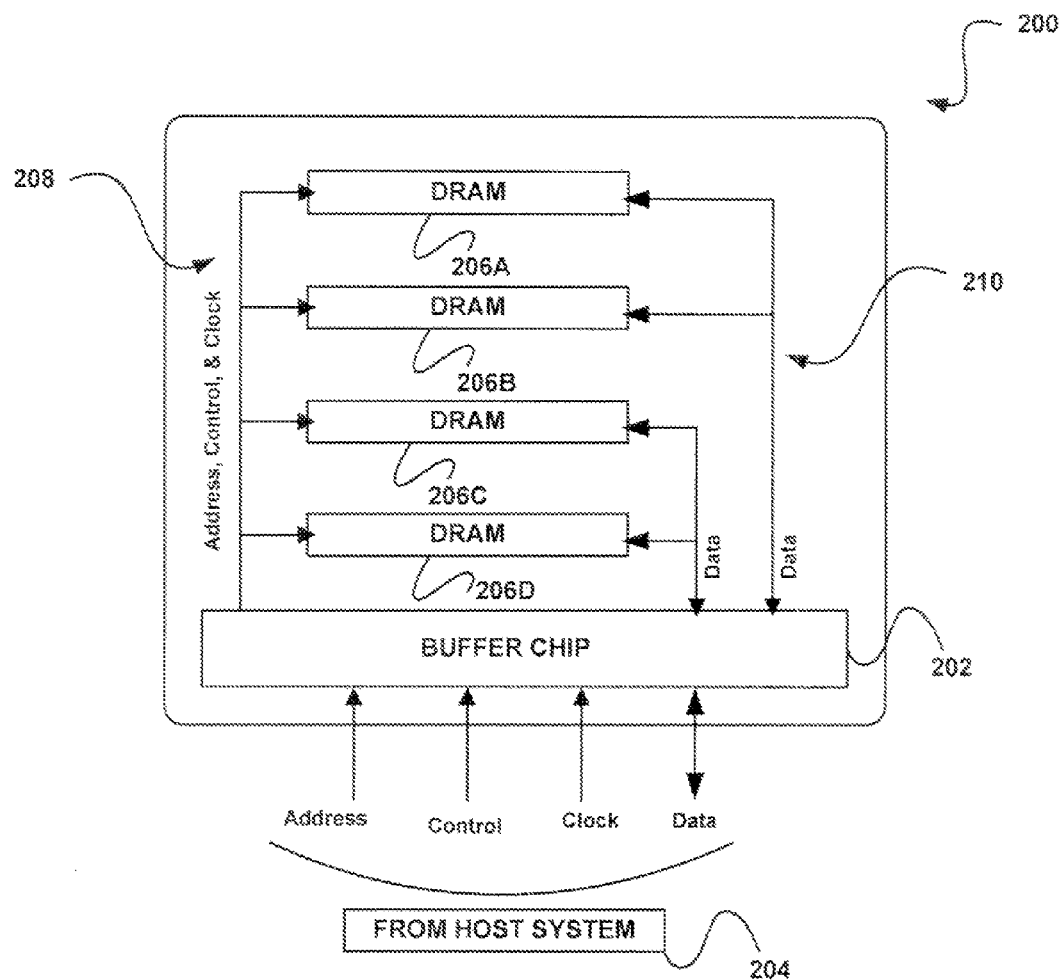
Figure 2D:
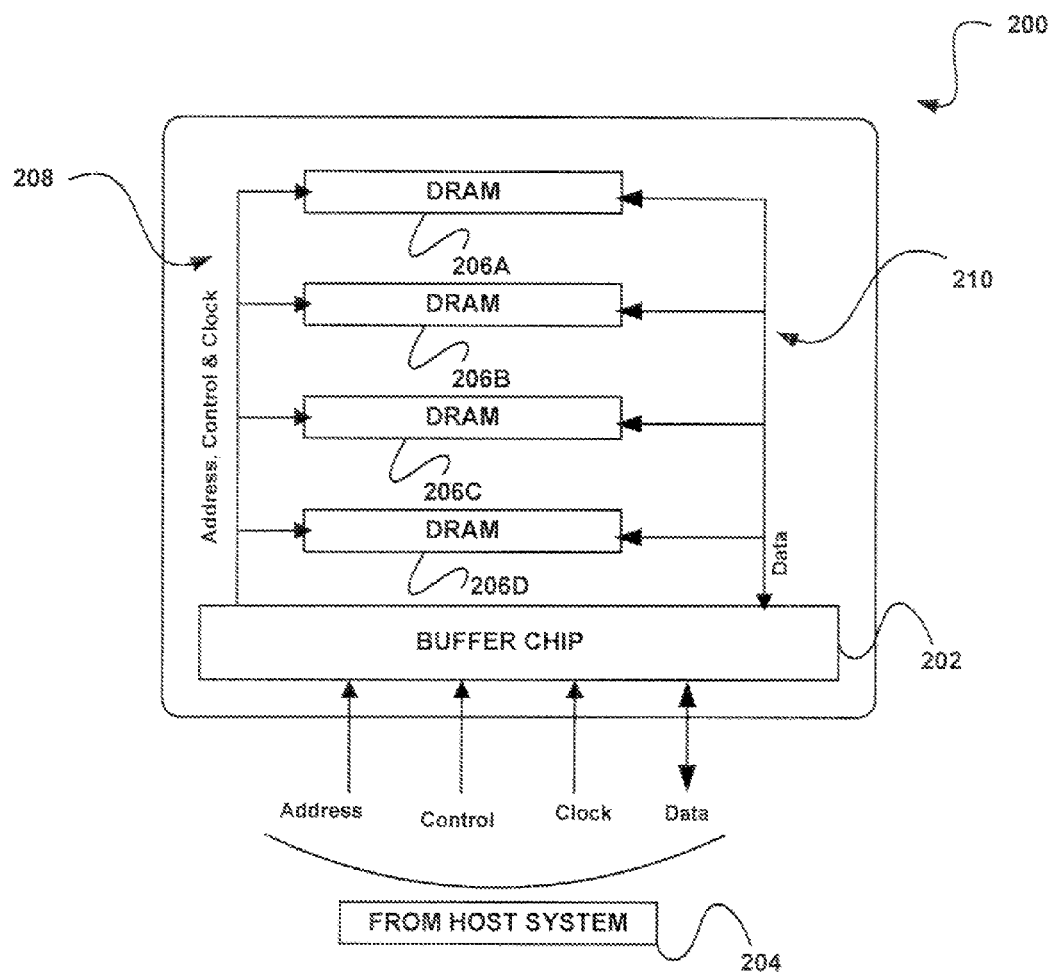
Figure 2E:
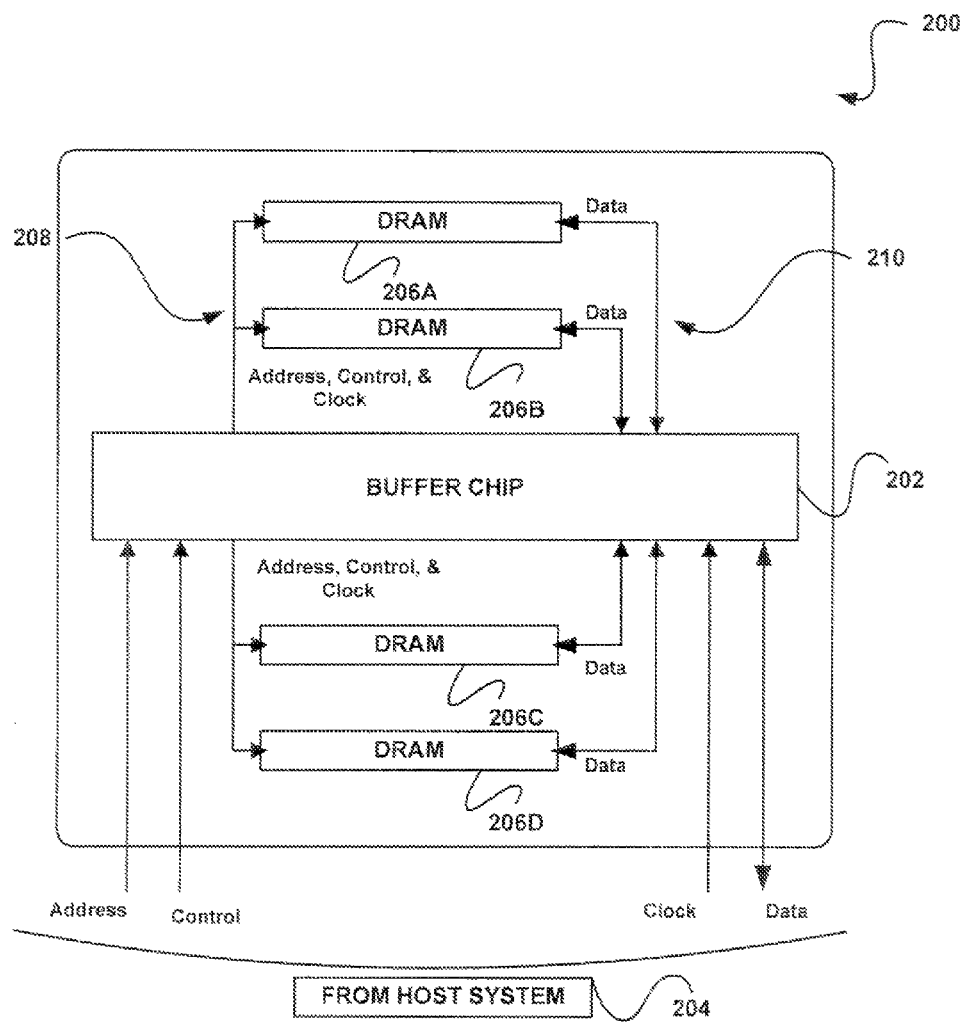

For example, as shown in FIG. 2A, the stack of DRAM circuits 206A-D may have one common address, control and clock bus 208 with individual data busses 210. In another example, as shown in FIG. 2B, the stack of DRAM circuits 206A-D may have two address, control and clock busses 208 along with two data busses 210. In still yet another example, as shown in FIG. 2C, the stack of DRAM circuits 206A-D may have one address, control and clock bus 208 together with two data busses 210. In addition, as shown in FIG. 2D, the stack of DRAM circuits 206A-D may have one common address, control and clock bus 208 and one common data bus 210. It should be noted that any other permutations and combinations of such address, control, clock and data buses may be utilized.

These configurations may therefore allow for the host system 204 to only be in contact with a load of the buffer chip 202 on the memory bus. In this way, any electrical loading problems (e.g. bad signal integrity, improper signal timing, etc.) associated with the stacked DRAM circuits 206A-D may (but not necessarily) be prevented, in the context of various optional embodiments.

Figure 2F:
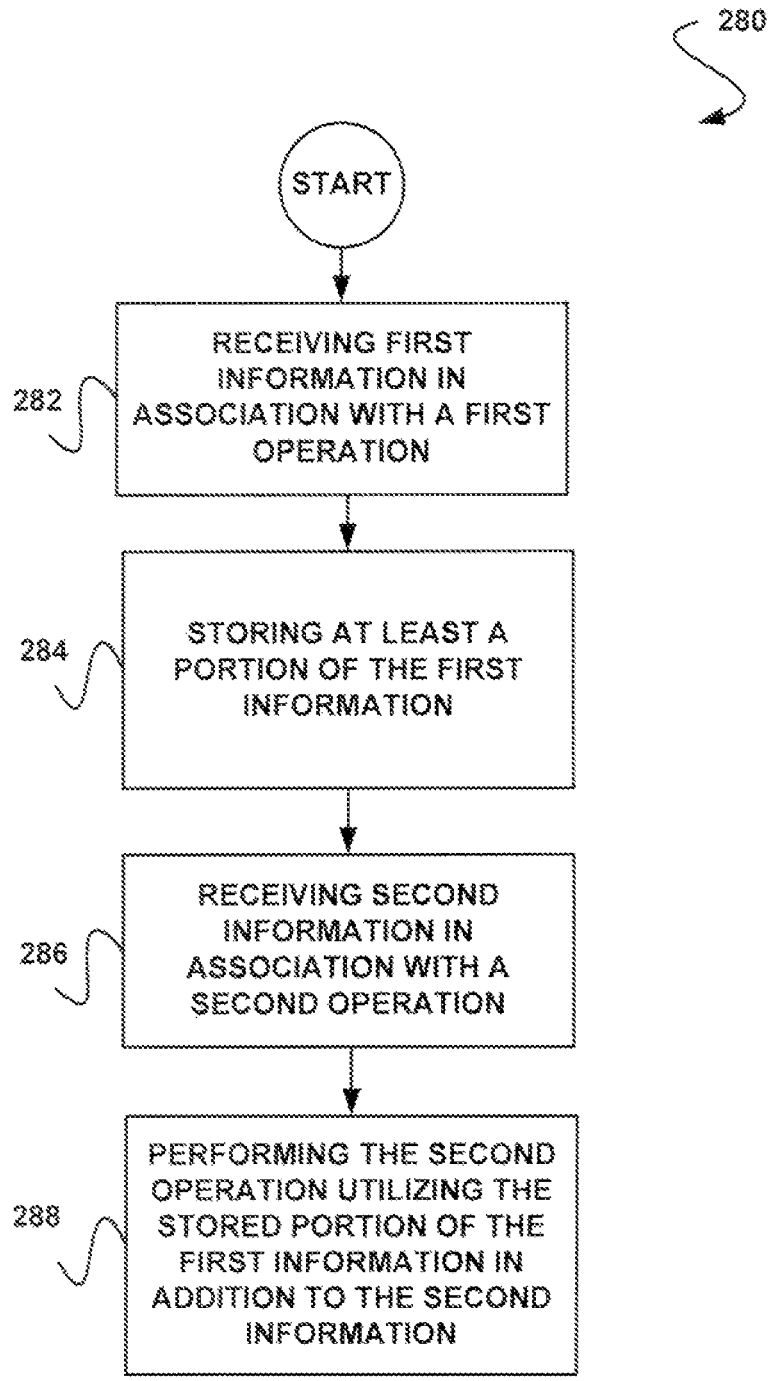
FIG. 2F illustrates a method for storing at least a portion of information received in association with a first operation for use in performing a second operation, in accordance with still another embodiment.

FIG. 2F illustrates a method 280 for storing at least a portion of information received in association with a first operation for use in performing a second operation, in accordance with still yet another embodiment. As an option, the method 280 may be implemented in the context of the architecture and/or environment of any one or more of FIGS. 1-2E. For example, the method 280 may be carried out by the interface circuit 102 of FIG. 1. Of course, however, the method 280 may be carried out in any desired environment. It should also be noted that the aforementioned definitions may apply during the present description.

In operation 282, first information is received in association with a first operation to be performed on at least one of a plurality of memory circuits (e.g. see the memory circuits 104A, 104B, 104N of FIG. 1, etc.). In various embodiments, such first information may or may not be received coincidently with the first operation, as long as it is associated in some capacity. Further, the first operation may, in one embodiment, include a row operation. In such embodiment, the first information may include address information (e.g. a set of address bits, etc.).

For reasons that will soon become apparent, at least a portion of the first information is stored. Note operation 284. Still yet, in operation 286, second information is received in association with a second operation. Similar to the first information, the second information may or may not be received coincidently with the second operation, and may include address information. Such second operation, however, may, in one embodiment, include a column operation.

To this end, the second operation may be performed utilizing the stored portion of the first information in addition to the second information. See operation 288. More illustrative information will now be set forth regarding various optional features with which the foregoing method 280 may or may not be implemented, per the desires of the user. Specifically, an example will be set for illustrating the manner in which the method 280 may be employed for accommodating a buffer chip that is simulating at least one aspect of a plurality of memory circuits.

In particular, the present example of the method 280 of FIG. 2F will be set forth in the context of the various components (e.g. buffer chip 202, etc.) shown in the embodiments of FIGS. 2A-2E. It should be noted that, since the buffered stack of DRAM circuits 206A-D may appear to the memory controller of the host system 204 as one or more larger capacity DRAM circuits, the buffer chip 202 may receive more address bits from the memory controller than are required by the DRAM circuits 206A-D in the stack. These extra address bits may be decoded by the buffer chip 202 to individually select the DRAM circuits 206A-D in the stack, utilizing separate chip select signals to each of the DRAM circuits 206A-D in the stack.

For example, a stack of four ×4 1 Gb DRAM circuits 206A-D behind a buffer chip 202 may appear as a single ×4 4 Gb DRAM circuit to the memory controller. Thus, the memory controller may provide sixteen row address bits and three bank address bits during a row (e.g. activate) operation, and provide eleven column address bits and three bank address bits during a column (e.g. read or write) operation. However, the individual DRAM circuits 206A-D in the stack may require only fourteen row address bits and three bank address bits for a row operation, and eleven column address bits and three bank address bits during a column operation.

As a result, during a row operation in the above example, the buffer chip 202 may receive two address bits more than are needed by each DRAM circuit 206A-D in the stack. The buffer chip 202 may therefore use the two extra address bits from the memory controller to select one of the four DRAM circuits 206A-D in the stack. In addition, the buffer chip 202 may receive the same number of address bits from the memory controller during a column operation as are needed by each DRAM circuit 206A-D in the stack.

Thus, in order to select the correct DRAM circuit 206A-D in the stack during a column operation, the buffer chip 202 may be designed to store the two extra address bits provided during a row operation and use the two stored address bits to select the correct DRAM circuit 206A-D during the column operation. The mapping between a system address (e.g. address from the memory controller, including the chip select signal(s)) and a device address (e.g. the address, including the chip select signals, presented to the DRAM circuits 206A-D in the stack) may be performed by the buffer chip 202 in various manners.

In one embodiment, a lower order system row address and bank address bits may be mapped directly to the device row address and bank address inputs. In addition, the most significant row address bit(s) and, optionally, the most significant bank address bit(s), may be decoded to generate the chip select signals for the DRAM circuits 206A-D in the stack during a row operation. The address bits used to generate the chip select signals during the row operation may also be stored in an internal lookup table by the buffer chip 202 for one or more clock cycles. During a column operation, the system column address and bank address bits may be mapped directly to the device column address and bank address inputs, while the stored address bits may be decoded to generate the chip select signals.

For example, addresses may be mapped between four 512 Mb DRAM circuits 206A-D that simulate a single 2 Gb DRAM circuits utilizing the buffer chip 202. There may be 15 row address bits from the system 204, such that row address bits 0 through 13 are mapped directly to the DRAM circuits 206A-D. There may also be 3 bank address bits from the system 204, such that bank address bits 0 through 1 are mapped directly to the DRAM circuits 206A-D.

During a row operation, the bank address bit 2 and the row address bit 14 may be decoded to generate the 4 chip select signals for each of the four DRAM circuits 206A-D. Row address bit 14 may be stored during the row operation using the bank address as the index. In addition, during the column operation, the stored row address bit 14 may again used with bank address bit 2 to form the four DRAM chip select signals.

As another example, addresses may be mapped between four 1 Gb DRAM circuits 206A-D that simulate a single 4 Gb DRAM circuits utilizing the buffer chip 202. There may be 16 row address bits from the system 204, such that row address bits 0 through 14 are mapped directly to the DRAM circuits 206A-D. There may also be 3 bank address bits from the system 204, such that bank address bits 0 through 3 are mapped directly to the DRAM circuits 206A-D.

During a row operation, row address bits 14 and 15 may be decoded to generate the 4 chip select signals for each of the four DRAM circuits 206A-D. Row address bits 14 and 15 may also be stored during the row operation using the bank address as the index. During the column operation, the stored row address bits 14 and 15 may again be used to form the four DRAM chip select signals.

In various embodiments, this mapping technique may optionally be used to ensure that there are no unnecessary combinational logic circuits in the critical timing path between the address input pins and address output pins of the buffer chip 202. Such combinational logic circuits may instead be used to generate the individual chip select signals. This may therefore allow the capacitive loading on the address outputs of the buffer chip 202 to be much higher than the loading on the individual chip select signal outputs of the buffer chip 202.

In another embodiment, the address mapping may be performed by the buffer chip 202 using some of the bank address signals from the memory controller to generate the individual chip select signals. The buffer chip 202 may store the higher order row address bits during a row operation using the bank address as the index, and then may use the stored address bits as part of the DRAM circuit bank address during a column operation. This address mapping technique may require an optional lookup table to be positioned in the critical timing path between the address inputs from the memory controller and the address outputs, to the DRAM circuits 206A-D in the stack.

For example, addresses may be mapped between four 512 Mb DRAM circuits 206A-D that simulate a single 2 Gb DRAM utilizing the buffer chip 202. There may be 15 row address bits from the system 204, where row address bits 0 through 13 are mapped directly to the DRAM circuits 206A-D. There may also be 3 bank address bits from the system 204, such that bank address bit 0 is used as a DRAM circuit bank address bit for the DRAM circuits 206A-D.

In addition, row address bit 14 may be used as an additional DRAM circuit bank address bit. During a row operation, the bank address bits 1 and 2 from the system may be decoded to generate the 4 chip select signals for each of the four DRAM circuits 206A-D. Further, row address bit 14 may be stored during the row operation. During the column operation, the stored row address bit 14 may again be used along with the bank address bit 0 from the system to form the DRAM circuit bank address.

In both of the above described address mapping techniques, the column address from the memory controller may be mapped directly as the column address to the DRAM circuits 206A-D in the stack. Specifically, this direct mapping may be performed since each of the DRAM circuits 206A-D in the stack, even if of the same width but different capacities (e.g. from 512 Mb to 4 Gb), may have the same page sizes. In an optional embodiment, address A[10] may be used by the memory controller to enable or disable auto-precharge during a column operation. Therefore, the buffer chip 202 may forward A[10] from the memory controller to the DRAM circuits 206A-D in the stack without any modifications during a column operation.

In various embodiments, it may be desirable to determine whether the simulated DRAM circuit behaves according to a desired DRAM standard or other design specification. A behavior of many DRAM circuits is specified by the JEDEC standards and it may be desirable, in some embodiments, to exactly simulate a particular JEDEC standard DRAM. The JEDEC standard defines control signals that a DRAM circuit must accept and the behavior of the DRAM circuit as a result of such control signals. For example, the JEDEC specification for a DDR2 DRAM is known as JESD79-2B.

If it is desired, for example, to determine whether a JEDEC standard is met, the following algorithm may be used. Such algorithm checks, using a set of software verification tools for formal verification of logic, that protocol behavior of the simulated DRAM circuit is the same as a desired standard or other design specification. This formal verification is quite feasible because the DRAM protocol described in a DRAM standard is typically limited to a few control signals (e.g. approximately 15 control signals in the case of the JEDEC DDR2 specification, for example).

Examples of the aforementioned software verification tools include MAGELLAN supplied by SYNOPSYS, or other software verification tools, such as INCISIVE supplied by CADENCE, verification tools supplied by JASPER, VERIX supplied by REAL INTENT, 0-IN supplied by MENTOR CORPORATION, and others. These software verification tools use written assertions that correspond to the rules established by the DRAM protocol and specification. These written assertions are further included in the code that forms the logic description for the buffer chip. By writing assertions that correspond to the desired behavior of the simulated DRAM circuit, a proof may be constructed that determines whether the desired design requirements are met. In this way, one may test various embodiments for compliance with a standard, multiple standards, or other design specification.

For instance, an assertion may be written that no two DRAM control signals are allowed to be issued to an address, control and clock bus at the same time. Although one may know which of the various buffer chip/DRAM stack configurations and address mappings that have been described herein are suitable, the aforementioned algorithm may allow a designer to prove that the simulated DRAM circuit exactly meets the required standard or other design specification. If, for example, an address mapping that uses a common bus for data and a common bus for address results in a control and clock bus that does not meet a required specification, alternative designs for buffer chips with other bus arrangements or alternative designs for the interconnect between the buffer chips may be used and tested for compliance with the desired standard or other design specification.

Figure 3:
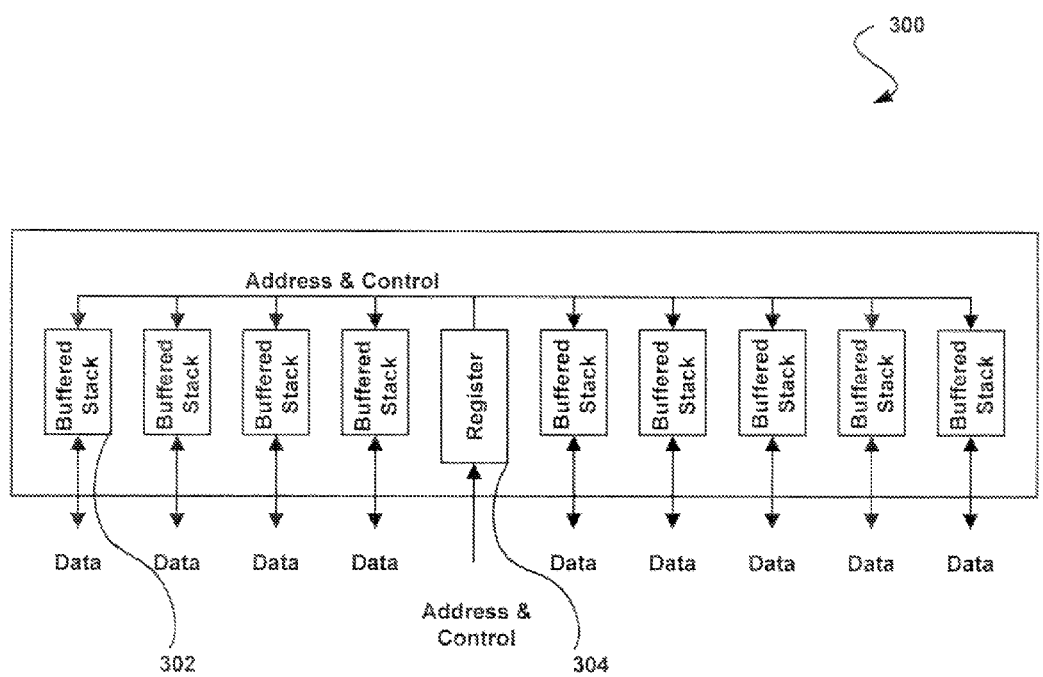
FIG. 3 shows a high capacity dual in-line memory module (DIMM) using buffered stacks, in accordance with still yet another embodiment.

FIG. 3 shows a high capacity DIMM 300 using buffered stacks of DRAM circuits 302, in accordance with still yet another embodiment. As an option, the high capacity DIMM 300 may be implemented in the context of the architecture and environment of FIGS. 1 and/or 2A-F. Of course, however, the high capacity DIMM 300 may be used in any desired environment. It should also be noted that the aforementioned definitions may apply during the present description.

As shown, a high capacity DIMM 300 may be created utilizing buffered stacks of DRAM circuits 302. Thus, a DIMM 300 may utilize a plurality of buffered stacks of DRAM circuits 302 instead of individual DRAM circuits, thus increasing the capacity of the DIMM. In addition, the DIMM 300 may include a register 304 for address and operation control of each of the buffered stacks of DRAM circuits 302. It should be noted that any desired number of buffered stacks of DRAM circuits 302 may be utilized in conjunction with the DIMM 300. Therefore, the configuration of the DIMM 300, as shown, should not be construed as limiting in any way.

In an additional unillustrated embodiment, the register 304 may be substituted with an AMB (not shown), in the context of an FB-DIMM.

Figure 4:
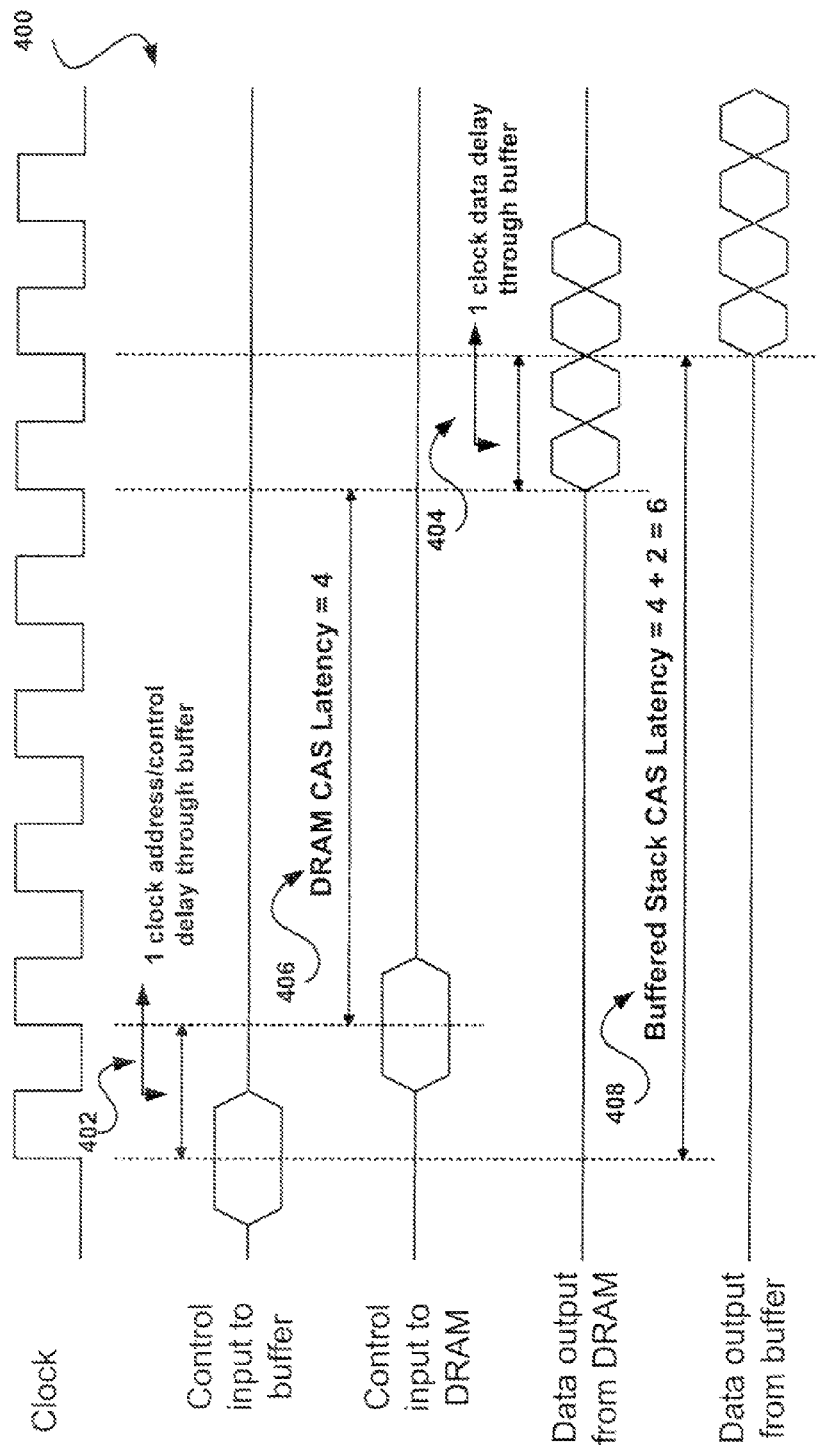
FIG. 4 shows a timing design of a buffer chip that makes a buffered stack of DRAM circuits mimic longer column address strobe (CAS) latency DRAM to a memory controller, in accordance with another embodiment.

FIG. 4 shows a timing design 400 of a buffer chip that makes a buffered stack of DRAM circuits mimic longer CAS latency DRAM to a memory controller, in accordance with another embodiment. As an option, the design of the buffer chip may be implemented in the context of the architecture and environment of FIGS. 1-3. Of course, however, the design of the buffer chip may be used in any desired environment. It should also be noted that the aforementioned definitions may apply during the present description.

In use, any delay through a buffer chip (e.g. see the buffer chip 202 of FIGS. 2A-E, etc.) may be made transparent to a memory controller of a host system (e.g. see the host system 204 of FIGS. 2A-E, etc.) utilizing the buffer chip. In particular, the buffer chip may buffer a stack of DRAM circuits such that the buffered stack of DRAM circuits appears as at least one larger capacity DRAM circuit with higher CAS latency.

Such delay may be a result of the buffer chip being located electrically between the memory bus of the host system and the stacked DRAM circuits, since most or all of the signals that connect the memory bus to the DRAM circuits pass through the buffer chip. A finite amount of time may therefore be needed for these signals to traverse through the buffer chip. With the exception of register chips and advanced memory buffers (AMB), industry standard protocols for memory [e.g. (DDR SDRAM), DDR2 SDRAM, etc.] may not comprehend the buffer chip that sits between the memory bus and the DRAM. Industry standard protocols for memory [e.g. (DDR SDRAM), DDR2 SDRAM, etc.] narrowly define the properties of chips that sit between host and memory circuits. Such industry standard protocols define the properties of a register chip and AMB but not the properties of the buffer chip 202, etc. Thus, the signal delay through the buffer chip may violate the specifications of industry standard protocols.

In one embodiment, the buffer chip may provide a one-half clock cycle delay between the buffer chip receiving address and control signals from the memory controller (or optionally from a register chip, an AMB, etc.) and the address and control signals being valid at the inputs of the stacked DRAM circuits. Similarly, the data signals may also have a one-half clock cycle delay in traversing the buffer chip, either from the memory controller to the DRAM circuits or from the DRAM circuits to the memory controller. Of course, the one-half clock cycle delay set forth above is set forth for illustrative purposes only and thus should not be construed as limiting in any manner whatsoever. For example, other embodiments are contemplated where a one clock cycle delay, a multiple clock cycle delay (or fraction thereof), and/or any other delay amount is incorporated, for that matter. As mentioned earlier, in other embodiments, the aforementioned delay may be coordinated among multiple signals such that different signals are subject to time-shifting with different relative directions/magnitudes, in an organized fashion.

As shown in FIG. 4, the cumulative delay through the buffer chip (e.g. the sum of a first delay 402 of the address and control signals through the buffer chip and a second delay 404 of the data signals through the buffer chip) is j clock cycles. Thus, the buffer chip may make the buffered stack appear to the memory controller as one or more larger DRAM circuits with a CAS latency 408 of i+j clocks, where i is the native CAS latency of the DRAM circuits.

In one example, if the DRAM circuits in the stack have a native CAS latency of 4 and the address and control signals along with the data signals experience a one-half clock cycle delay through the buffer chip, then the buffer chip may make the buffered stack appear to the memory controller as one or more larger DRAM circuits with a CAS latency of 5 (i.e. 4+1). In another example, if the address and control signals along with the data signals experience a 1 clock cycle delay through the buffer chip, then the buffer chip may make the buffered stack appear as one or more larger DRAM circuits with a CAS latency of 6 (i.e. 4+2).

Figure 5:
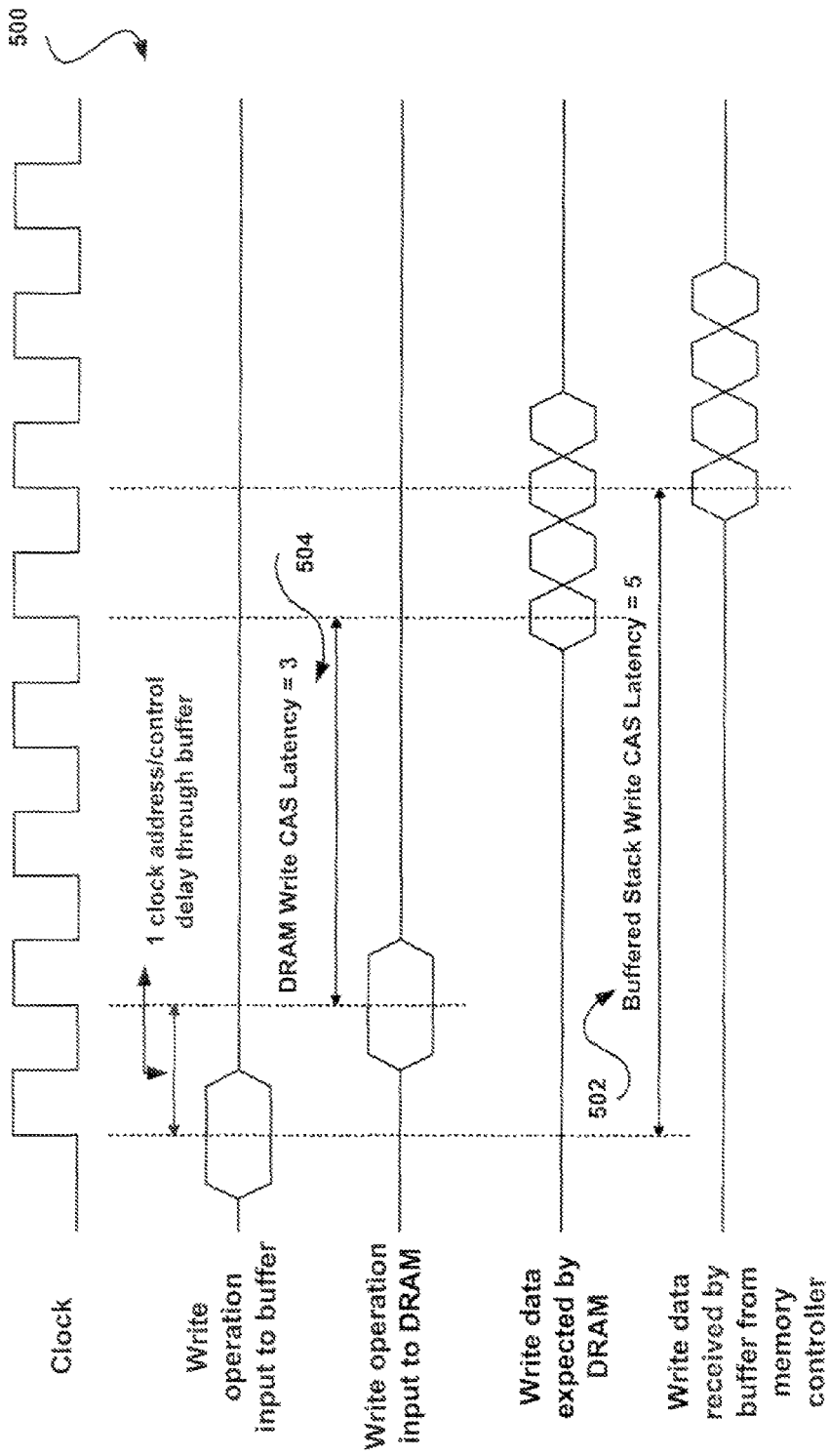
FIG. 5 shows the write data timing expected by DRAM in a buffered stack, in accordance with yet another embodiment.

FIG. 5 shows the write data timing 500 expected by a DRAM circuit in a buffered stack, in accordance with yet another embodiment. As an option, the write data timing 500 may be implemented in the context of the architecture and environment of FIGS. 1-4. Of course, however, the write data timing 500 may be carried out in any desired environment. It should also be noted that the aforementioned definitions may apply during the present description.

Designing a buffer chip (e.g. see the buffer chip 202 of FIGS. 2A-E, etc.) so that a buffered stack appears as at least one larger capacity DRAM circuit with higher CAS latency may, in some embodiments, create a problem with the timing of write operations. For example, with respect to a buffered stack of DDR2 SDRAM circuits with a CAS latency of 4 that appear as a single larger DDR2 SDRAM with a CAS latency of 6 to the memory controller, the DDR2 SDRAM protocol may specify that the write CAS latency is one less than the read CAS latency. Therefore, since the buffered stack appears as a DDR2 SDRAM with a read CAS latency of 6, the memory controller may use a write CAS latency of 5 (see 502) when scheduling a write operation to the buffered stack.

However, since the native read CAS latency of the DRAM circuits is 4, the DRAM circuits may require a write CAS latency of 3 (see 504). As a result, the write data from the memory controller may arrive at the buffer chip later than when the DRAM circuits require the data. Thus, the buffer chip may delay such write operations to alleviate any of such timing problems. Such delay in write operations will be described in more detail with respect to FIG. 6 below.

Figure 6:
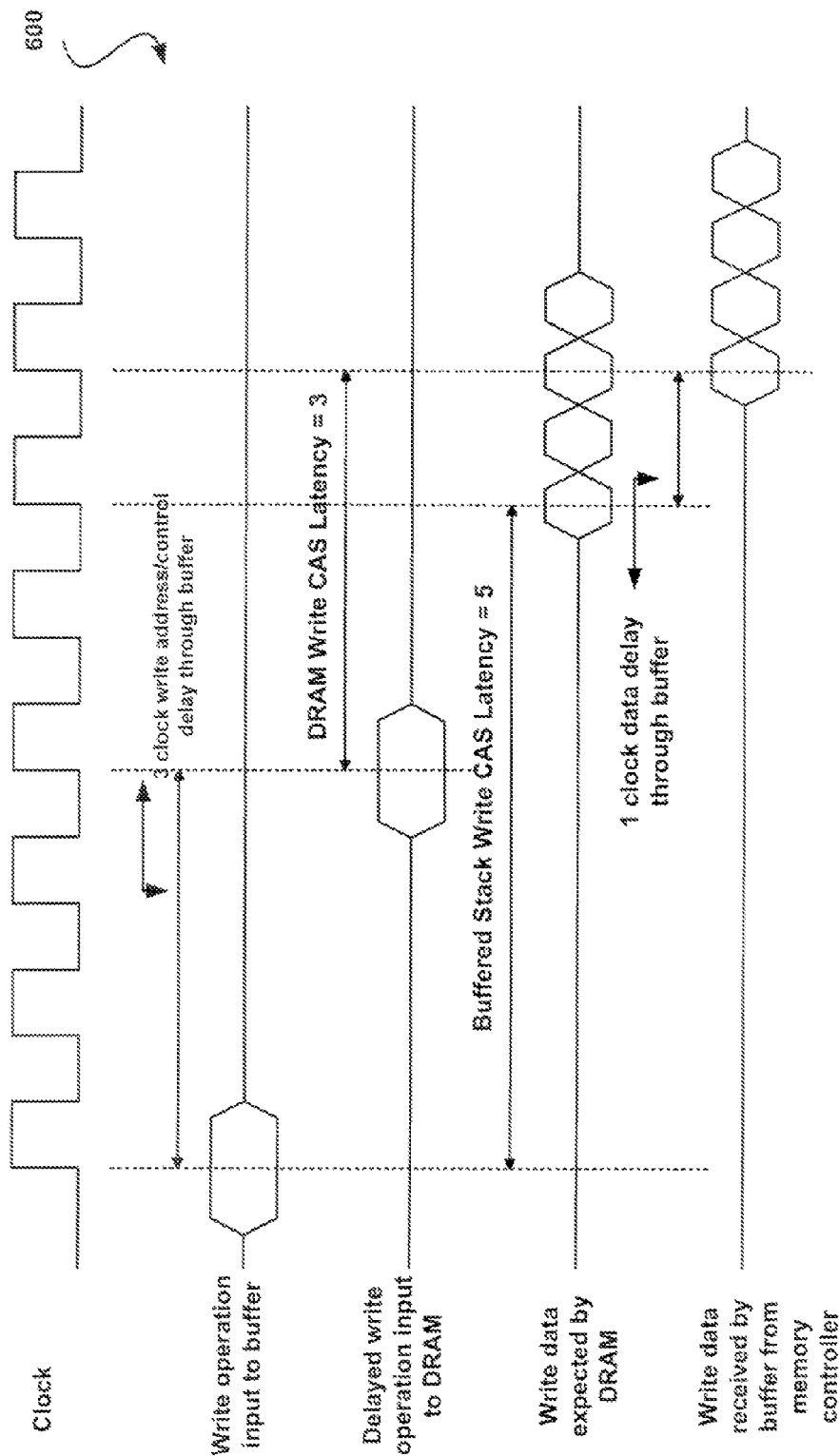
FIG. 6 shows write control signals delayed by a buffer chip, in accordance with still yet another embodiment.

FIG. 6 shows write operations 600 delayed by a buffer chip, in accordance with still yet another embodiment. As an option, the write operations 600 may be implemented in the context of the architecture and environment of FIGS. 1-5. Of course, however, the write operations 600 may be used in any desired environment. Again, it should also be noted that the aforementioned definitions may apply during the present description.

In order to be compliant with the protocol utilized by the DRAM circuits in the stack, a buffer chip (e.g. see the buffer chip 202 of FIGS. 2A-E, etc.) may provide an additional delay, over and beyond the delay of the address and control signals through the buffer chip, between receiving the write operation and address from the memory controller (and/or optionally from a register and/or AMB, etc.), and sending it to the DRAM circuits in the stack. The additional delay may be equal to j clocks, where j is the cumulative delay of the address and control signals through the buffer chip and the delay of the data signals through the buffer chip. As another option, the write address and operation may be delayed by a register chip on a DIMM, by an AMB, or by the memory controller.

Figure 7:
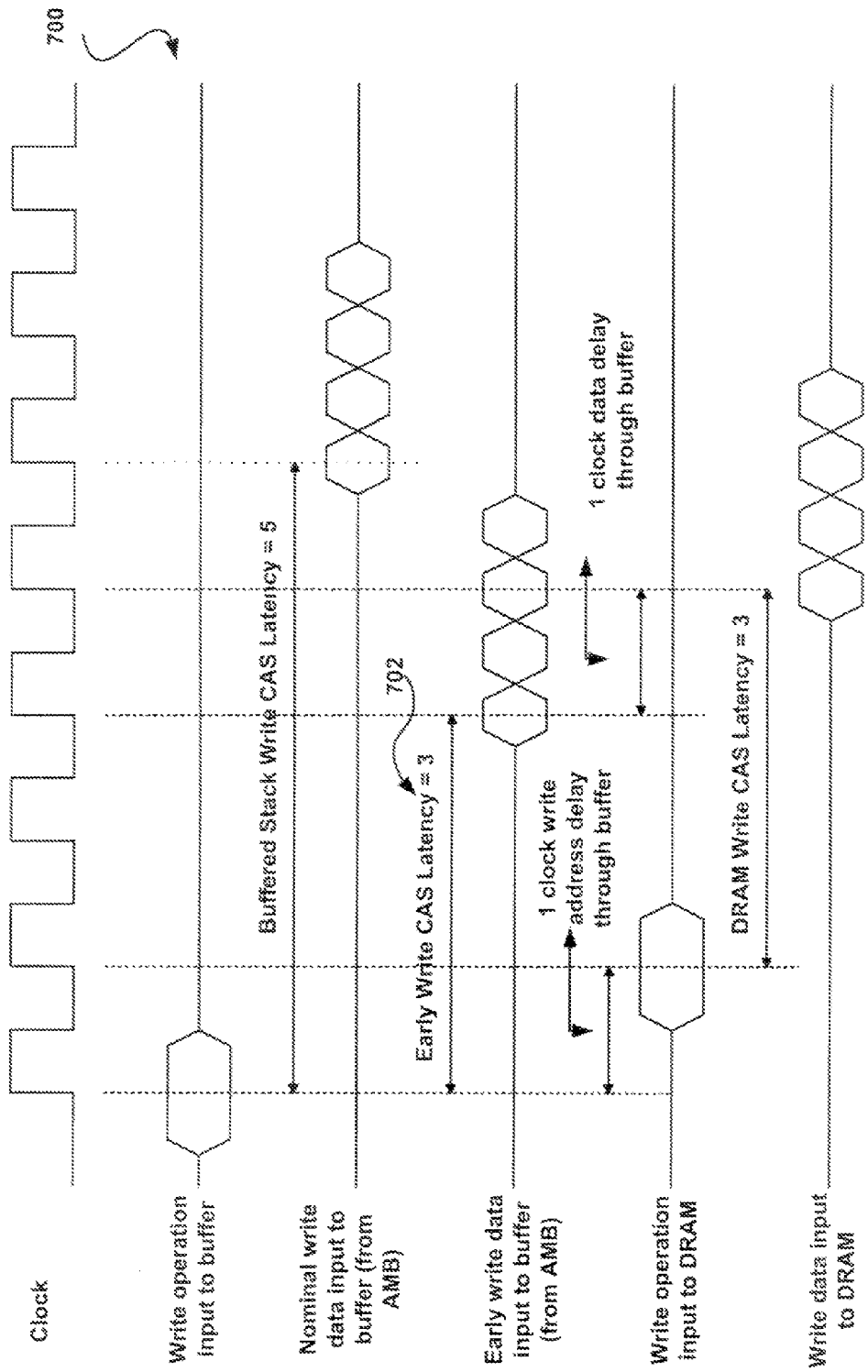
FIG. 7 shows early write data from an advanced memory buffer (AMB), in accordance with another embodiment.

FIG. 7 shows early write data 700 from an AMB, in accordance with another embodiment. As an option, the early write data 700 may be implemented in the context of the architecture and environment of FIGS. 1-5. Of course, however, the early write data 700 may be used in any desired environment. It should also be noted that the aforementioned definitions may apply during the present description.

As shown, an AMB on an FB-DIMM may be designed to send write data earlier to buffered stacks instead of delaying the write address and operation, as described in reference to FIG. 6. Specifically, an early write latency 702 may be utilized to send the write data to the buffered stack. Thus, correct timing of the write operation at the inputs of the DRAM circuits in the stack may be ensured.

For example, a buffer chip (e.g. see the buffer chip 202 of FIGS. 2A-E, etc.) may have a cumulative latency of 2, in which case, the AMB may send the write data 2 clock cycles earlier to the buffered stack. It should be noted that this scheme may not be possible in the case of registered DIMMs since the memory controller sends the write data directly to the buffered stacks. As an option, a memory controller may be designed to send write data earlier so that write operations have the correct timing at the input of the DRAM circuits in the stack without requiring the buffer chip to delay the write address and operation.

Figure 8:
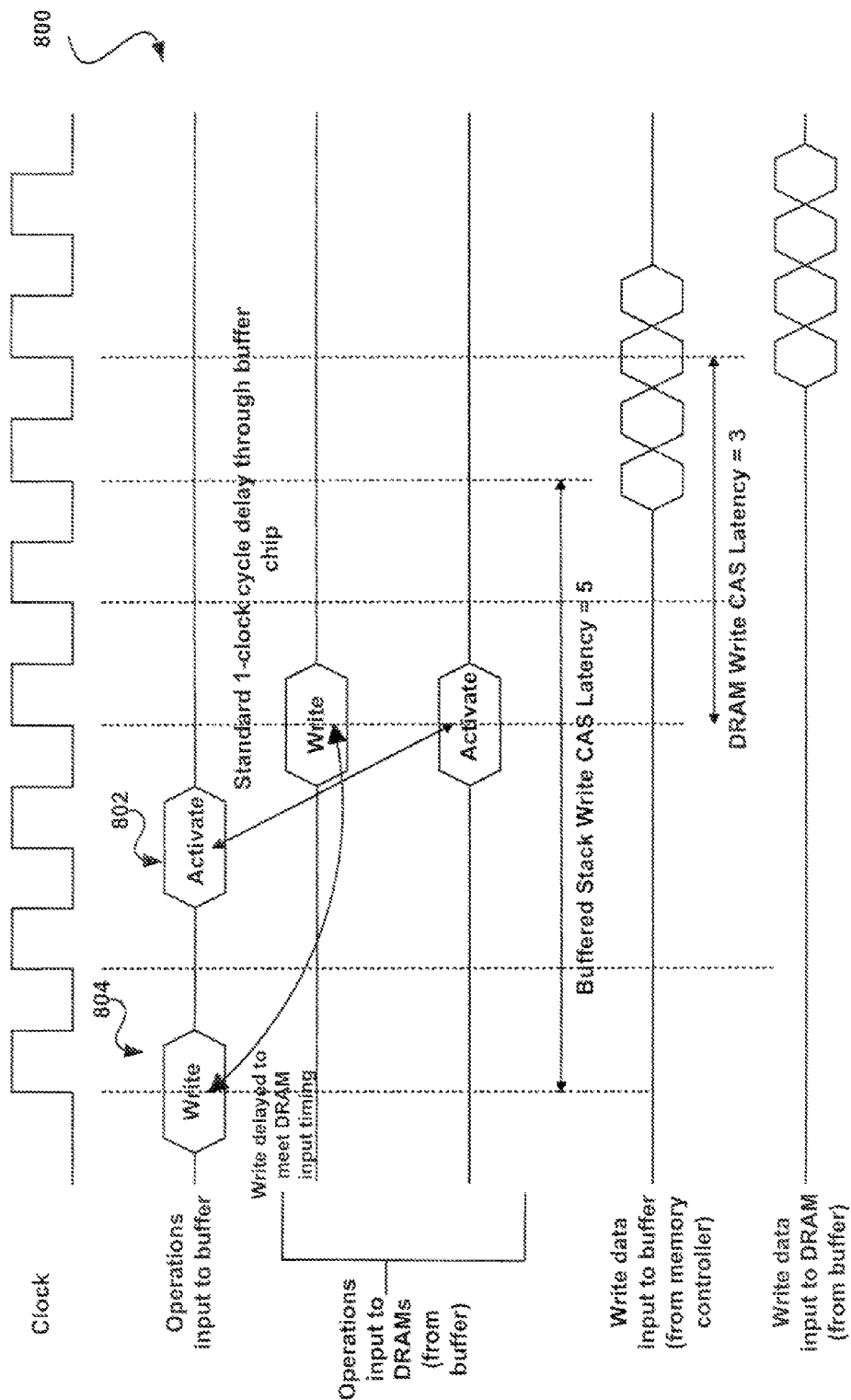
FIG. 8 shows address bus conflicts caused by delayed write operations, in accordance with yet another embodiment.

FIG. 8 shows address bus conflicts 800 caused by delayed write operations, in accordance with yet another embodiment. As mentioned earlier, the delaying of the write addresses and operations may be performed by a buffer chip, or optionally a register, AMB, etc., in a manner that is completely transparent to the memory controller of a host system. However, since the memory controller is unaware of this delay, it may schedule subsequent operations, such as for example activate or precharge operations, which may collide with the delayed writes on the address bus from the buffer chip to the DRAM circuits in the stack. As shown, an activate operation 802 may interfere with a write operation 804 that has been delayed. Thus, a delay of activate operations may be employed, as will be described in further detail with respect to FIG. 9.

Figure 9A:
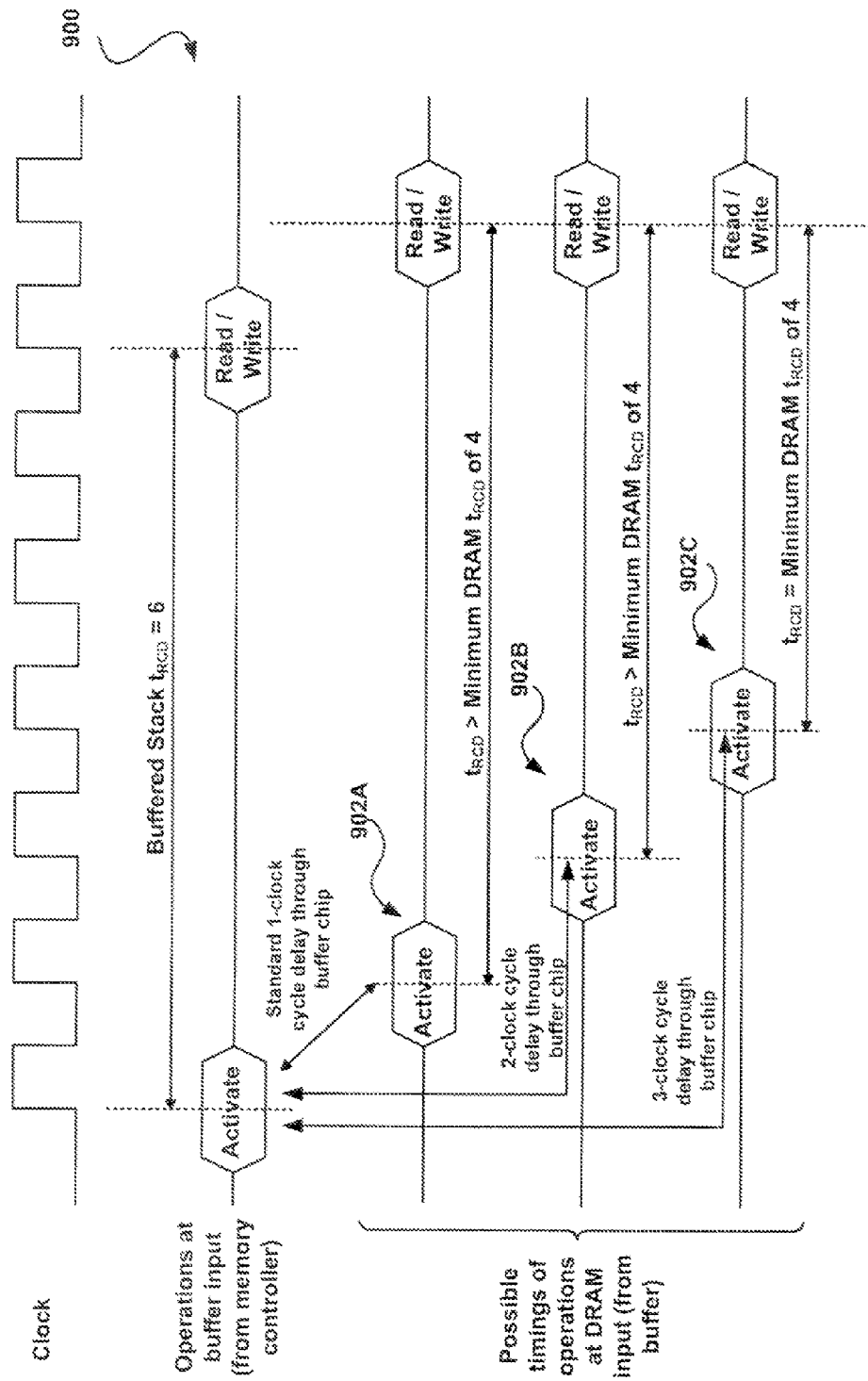
FIGS. 9A-B show variable delays of operations through a buffer chip, in accordance with another embodiment.
Figure 9B:
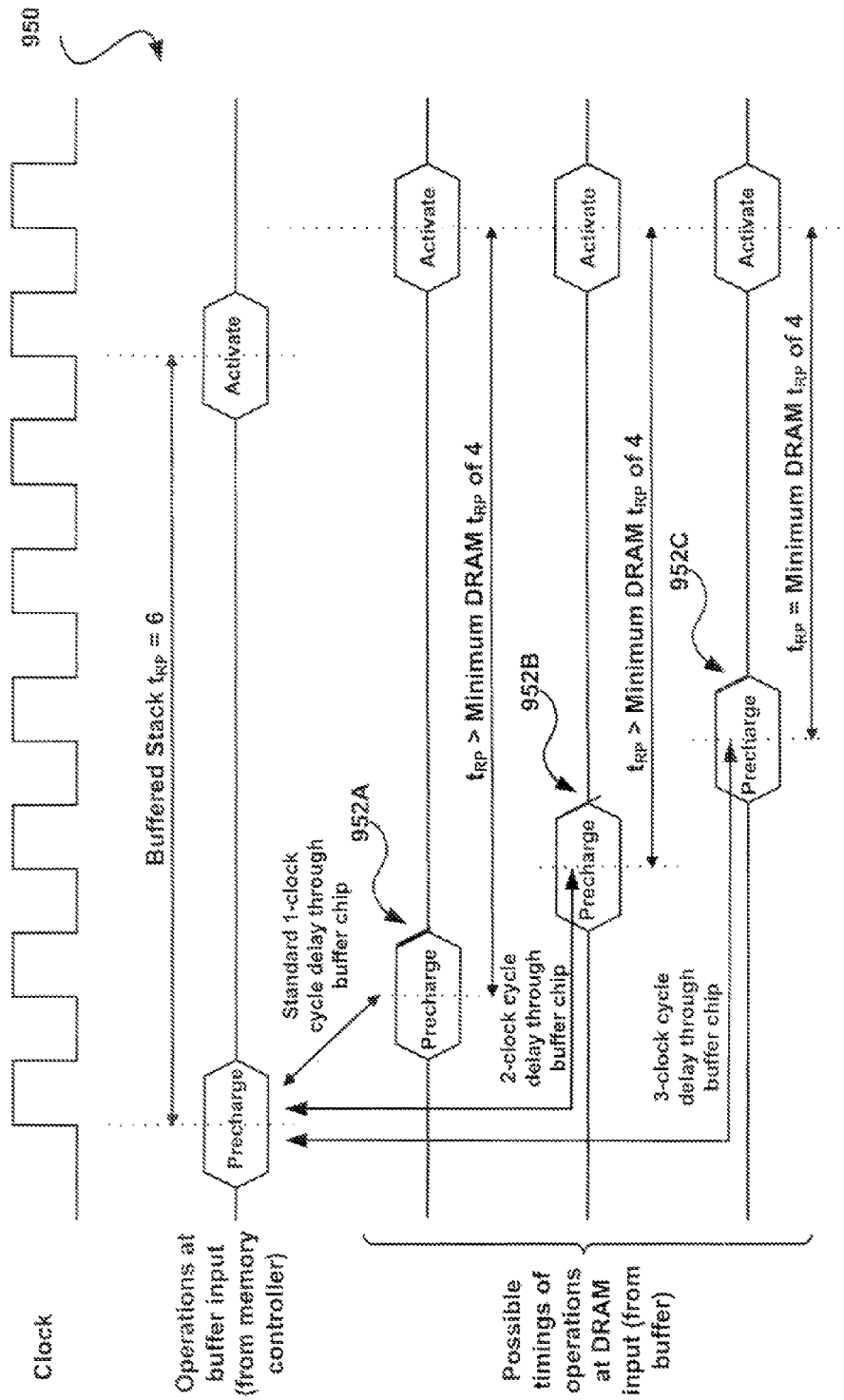

FIGS. 9A-B show variable delays 900 and 950 of operations through a buffer chip, in accordance with another embodiment. As an option, the variable delays 900 and 950 may be implemented in the context of the architecture and environment of FIGS. 1-8. Of course, however, the variable delays 900 and 950 may be carried out in any desired environment. It should also be noted that the aforementioned definitions may apply during the present description.

In order to prevent conflicts on an address bus between the buffer chip and its associated stack(s), either the write operation or the precharge/activate operation may be delayed. As shown, a buffer chip (e.g. see the buffer chip 202 of FIGS. 2A-E, etc.) may delay the precharge/activate operations 952A-C/902A-C. In particular, the buffer chip may make the buffered stack appear as one or more larger capacity DRAM circuits that have longer tRCD (RAS to CAS delay) and tRP (i.e. precharge time) parameters.

For example, if the cumulative latency through a buffer chip is 2 clock cycles while the native read CAS latency of the DRAM circuits is 4 clock cycles, then in order to hide the delay of the address/control signals and the data signals through the buffer chip, the buffered stack may appear as one or more larger capacity DRAM circuits with a read CAS latency of 6 clock cycles to the memory controller. In addition, if the tRCD and tRP of the DRAM circuits is 4 clock cycles each, the buffered stack may appear as one or more larger capacity DRAM circuits with tRCD of 6 clock cycles and tRP of 6 clock cycles in order to allow a buffer chip (e.g., see the buffer chip 202 of FIGS. 2A-E, etc.) to delay the activate and precharge operations in a manner that is transparent to the memory controller. Specifically, a buffered stack that uses 4-4-4 DRAM circuits (i.e. CAS latency=4, tRCD=4, tRP=4) may appear as one or at least one larger capacity DRAM circuits with 6-6-6 timing (i.e. CAS latency=6, tRCD=6, tRP=6).

Since the buffered stack appears to the memory controller as having a tRCD of 6 clock cycles, the memory controller may schedule a column operation to a bank 6 clock cycles after an activate (e.g. row) operation to the same bank. However, the DRAM circuits in the stack may actually have a tRCD of 4 clock cycles. Thus, the buffer chip may have the ability to delay the activate operation by up to 2 clock cycles in order to avoid any conflicts on the address bus between the buffer chip and the DRAM circuits in the stack while still ensuring correct read and write timing on the channel between the memory controller and the buffered stack.

As shown, the buffer chip may issue the activate operation to the DRAM circuits one, two, or three clock cycles after it receives the activate operation from the memory controller, register, or AMB. The actual delay of the activate operation through the buffer chip may depend on the presence or absence of other DRAM operations that may conflict with the activate operation, and may optionally change from one activate operation to another.

Similarly, since the buffered stack may appear to the memory controller as at least one larger capacity DRAM circuit with a tRP of 6 clock cycles, the memory controller may schedule a subsequent activate (e.g. row) operation to a bank a minimum of 6 clock cycles after issuing a precharge operation to that bank. However, since the DRAM circuits in the stack actually have a tRP of 4 clock cycles, the buffer chip may have the ability to delay issuing the precharge operation to the DRAM circuits in the stack by up to 2 clock cycles in order to avoid any conflicts on the address bus between the buffer chip and the DRAM circuits in the stack. In addition, even if there are no conflicts on the address bus, the buffer chip may still delay issuing a precharge operation in order to satisfy the tRAS requirement of the DRAM circuits.

In particular, if the activate operation to a bank was delayed to avoid an address bus conflict, then the precharge operation to the same bank may be delayed by the buffer chip to satisfy the tRAS requirement of the DRAM circuits. The buffer chip may issue the precharge operation to the DRAM circuits one, two, or three clock cycles after it receives the precharge operation from the memory controller, register, or AMB. The actual delay of the precharge operation through the buffer chip may depend on the presence or absence of address bus conflicts or tRAS violations, and may change from one precharge operation to another.

Figure 10:
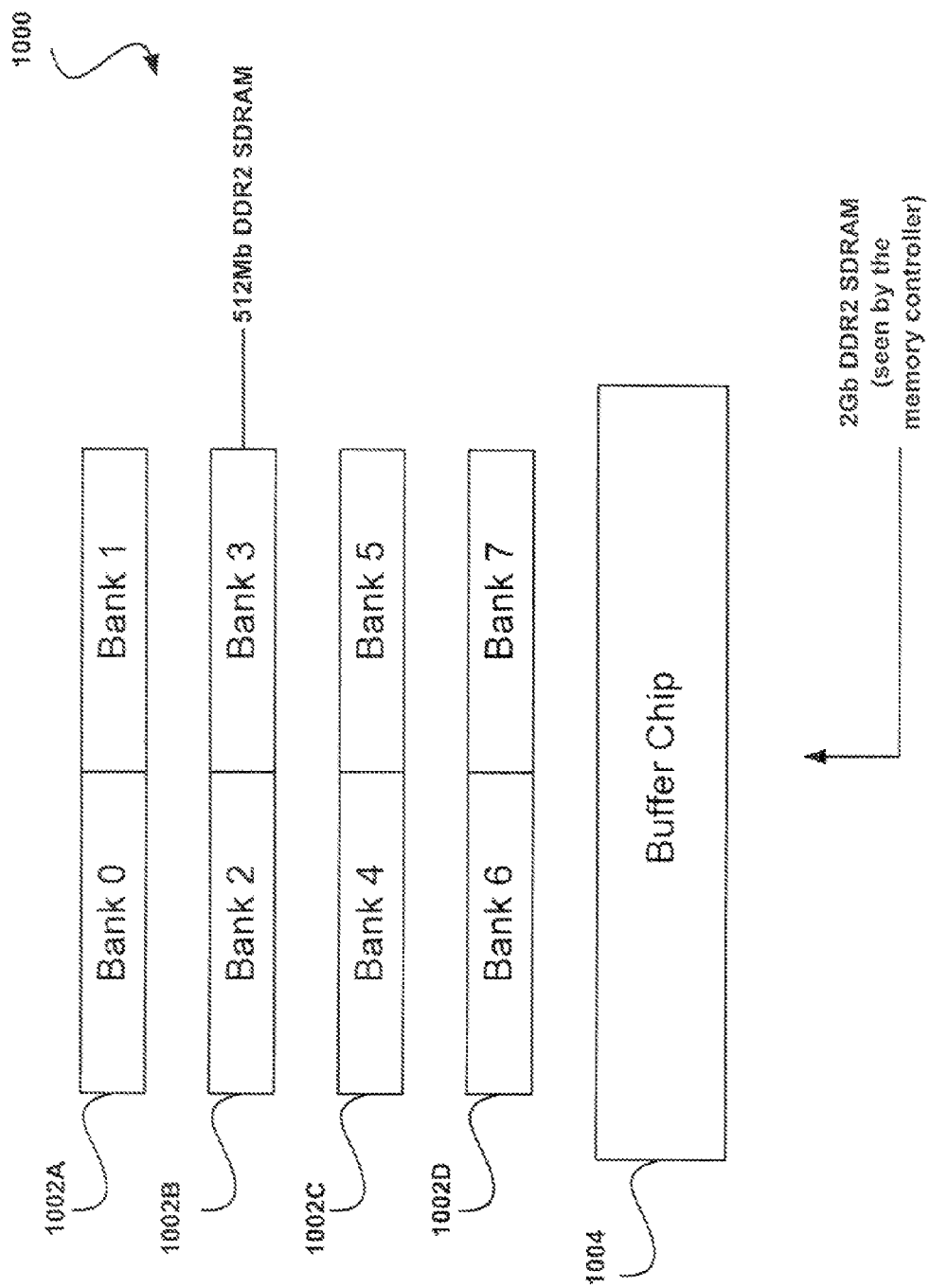
FIG. 10 shows a buffered stack of four 512 Mb DRAM circuits mapped to a single 2 Gb DRAM circuit, in accordance with yet another embodiment.

FIG. 10 shows a buffered stack 1000 of four 512 Mb DRAM circuits mapped to a single 2 Gb DRAM circuit, in accordance with yet another embodiment. As an option, the buffered stack 1000 may be implemented in the context of the architecture and environment of FIGS. 1-9. Of course, however, the buffered stack 1000 may be carried out in any desired environment. It should also be noted that the aforementioned definitions may apply during the present description.

The multiple DRAM circuits 1002A-D buffered in the stack by the buffer chip 1004 may appear as at least one larger capacity DRAM circuit to the memory controller. However, the combined power dissipation of such DRAM circuits 1002A-D may be much higher than the power dissipation of a monolithic DRAM of the same capacity. For example, the buffered stack may consist of four 512 Mb DDR2 SDRAM circuits that appear to the memory controller as a single 2 Gb DDR2 SDRAM circuit.

The power dissipation of all four DRAM circuits 1002A-D in the stack may be much higher than the power dissipation of a monolithic 2 Gb DDR2 SDRAM. As a result, a DIMM containing multiple buffered stacks may dissipate much more power than a standard DIMM built using monolithic DRAM circuits. This increased power dissipation may limit the widespread adoption of DIMMs that use buffered stacks.

Thus, a power management technique that reduces the power dissipation of DIMMs that contain buffered stacks of DRAM circuits may be utilized. Specifically, the DRAM circuits 1002A-D may be opportunistically placed in a precharge power down mode using the clock enable (CKE) pin of the DRAM circuits 1002A-D. For example, a single rank registered DIMM (R-DIMM) may contain a plurality of buffered stacks of DRAM circuits 1002A-D, where each stack consists of four ×4 512 Mb DDR2 SDRAM circuits 1002A-D and appears as a single ×4 2 Gb DDR2 SDRAM circuit to the memory controller. A 2 Gb DDR2 SDRAM may generally have eight banks as specified by JEDEC. Therefore, the buffer chip 1004 may map each 512 Mb DRAM circuit in the stack to two banks of the equivalent 2 Gb DRAM, as shown.

The memory controller of the host system may open and close pages in the banks of the DRAM circuits 1002A-D based on the memory requests it receives from the rest of the system. In various embodiments, no more than one page may be able to be open in a bank at any given time. For example, with respect to FIG. 10, since each DRAM circuit 1002A-D in the stack is mapped to two banks of the equivalent larger DRAM, at any given time a DRAM circuit 1002A-D may have two open pages, one open page, or no open pages. When a DRAM circuit 1002A-D has no open pages, the power management scheme may place that DRAM circuit 1002A-D in the precharge power down mode by de-asserting its CKE input.

The CKE inputs of the DRAM circuits 1002A-D in a stack may be controlled by the buffer chip 1004, by a chip on an R-DIMM, by an AMB on a FB-DIMM, or by the memory controller in order to implement the power management scheme described hereinabove. In one embodiment, this power management scheme may be particularly efficient when the memory controller implements a closed page policy.

Another optional power management scheme may include mapping a plurality of DRAM circuits to a single bank of the larger capacity DRAM seen by the memory controller. For example, a buffered stack of sixteen ×4 256 Mb DDR2 SDRAM circuits may appear to the memory controller as a single ×4 4 Gb DDR2 SDRAM circuit. Since a 4 Gb DDR2 SDRAM circuit is specified by JEDEC to have eight banks, each bank of the 4 Gb DDR2 SDRAM circuit may be 512 Mb. Thus, two of the 256 Mb DDR2 SDRAM circuits may be mapped by the buffer chip 1004 to a single bank of the equivalent 4 Gb DDR2 SDRAM circuit seen by the memory controller.

In this way, bank 0 of the 4 Gb DDR2 SDRAM circuit may be mapped by the buffer chip to two 256 Mb DDR2 SDRAM circuits (e.g. DRAM A and DRAM B) in the stack. However, since only one page can be open in a bank at any given time, only one of DRAM A or DRAM B may be in the active state at any given time. If the memory controller opens a page in DRAM A, then DRAM B may be placed in the precharge power down mode by de-asserting its CKE input. As another option, if the memory controller opens a page in DRAM B, DRAM A may be placed in the precharge power down mode by de-asserting its CKE input. This technique may ensure that if p DRAM circuits are mapped to a bank of the larger capacity DRAM circuit seen by the memory controller, then p-1 of the p DRAM circuits may continuously (e.g. always, etc.) be subjected to a power saving operation. The power saving operation may, for example, comprise operating in precharge power down mode except when refresh is required. Of course, power-savings may also occur in other embodiments without such continuity.

Figure 11:
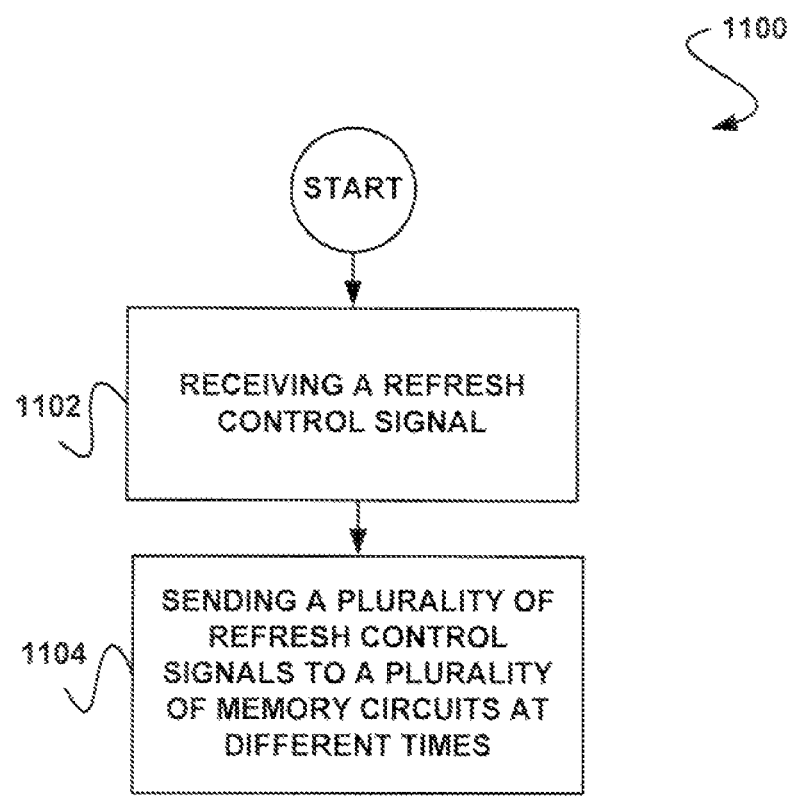
FIG. 11 illustrates a method for refreshing a plurality of memory circuits, in accordance with still yet another embodiment.

FIG. 11 illustrates a method 1100 for refreshing a plurality of memory circuits, in accordance with still yet another embodiment. As an option, the method 1100 may be implemented in the context of the architecture and environment of any one or more of FIGS. 1-10. For example, the method 1100 may be carried out by the interface circuit 102 of FIG. 1. Of course, however, the method 1100 may be carried out in any desired environment. It should also be noted that the aforementioned definitions may apply during the present description.

As shown, a refresh control signal is received in operation 1102. In one optional embodiment, such refresh control signal may, for example, be received from a memory controller, where such memory controller intends to refresh a simulated memory circuit(s).

In response to the receipt of such refresh control signal, a plurality of refresh control signals are sent to a plurality of the memory circuits (e.g. see the memory circuits 104A, 104B, 104N of FIG. 1, etc.), at different times. See operation 1104. Such refresh control signals may or may not each include the refresh control signal of operation 1102 or an instantiation/copy thereof. Of course, in other embodiments, the refresh control signals may each include refresh control signals that are different in at least one aspect (e.g. format, content, etc.).

During use of still additional embodiments, at least one first refresh control signal may be sent to a first subset (e.g. of one or more) of the memory circuits at a first time and at least one second refresh control signal may be sent to a second subset (e.g. of one or more) of the memory circuits at a second time. Thus, in some embodiments, a single refresh control signal may be sent to a plurality of the memory circuits (e.g. a group of memory circuits, etc.). Further, a plurality of the refresh control signals may be sent to a plurality of the memory circuits. To this end, refresh control signals may be sent individually or to groups of memory circuits, as desired.

Thus, in still yet additional embodiments, the refresh control signals may be sent after a delay in accordance with a particular timing. In one embodiment, for example, the timing in which the refresh control signals are sent to the memory circuits may be selected to minimize a current draw. This may be accomplished in various embodiments by staggering a plurality of refresh control signals. In still other embodiments, the timing in which the refresh control signals are sent to the memory circuits may be selected to comply with a tRFC parameter associated with each of the memory circuits.

To this end, in the context of an example involving a plurality of DRAM circuits (e.g. see the embodiments of FIGS. 1-2E, etc.), DRAM circuits of any desired size may receive periodic refresh operations to maintain the integrity of data therein. A memory controller may initiate refresh operations by issuing refresh control signals to the DRAM circuits with sufficient frequency to prevent any loss of data in the DRAM circuits. After a refresh control signal is issued to a DRAM circuit, a minimum time (e.g. denoted by tRFC) may be required to elapse before another control signal may be issued to that DRAM circuit. The tRFC parameter may therefore increase as the size of the DRAM circuit increases.

When the buffer chip receives a refresh control signal from the memory controller, it may refresh the smaller DRAM circuits within the span of time specified by the tRFC associated with the emulated DRAM circuit. Since the tRFC of the emulated DRAM circuits is larger than that of the smaller DRAM circuits, it may not be necessary to issue refresh control signals to all of the smaller DRAM circuits simultaneously. Refresh control signals may be issued separately to individual DRAM circuits or may be issued to groups of DRAM circuits, provided that the tRFC requirement of the smaller DRAM circuits is satisfied by the time the tRFC of the emulated DRAM circuits has elapsed. In use, the refreshes may be spaced to minimize the peak current draw of the combination buffer chip and DRAM circuit set during a refresh operation.

While various embodiments have been described above, it should be understood that they have been presented by way of example only, and not limitation. For example, any of the network elements may employ any of the desired functionality set forth hereinabove. Thus, the breadth and scope of a preferred embodiment should not be limited by any of the above-described exemplary embodiments, but should be defined only in accordance with the following claims and their equivalents.

What is claimed is:

1. An apparatus, comprising:
a plurality of first memory circuits, the plurality of first memory circuits positioned on at least one dual in-line memory module (DIMM); and
an interface circuit operable to:
interface the plurality of first memory circuits with a system;
present the first memory circuits to the system as one or more simulated second memory circuits, each simulated second memory circuit having a corresponding second memory capacity that is greater than a first memory capacity of at least one of the first memory circuits; and
transmit, in response to receiving a first refresh control signal sent from the system to the one or more simulated second memory circuits, a plurality of second refresh control signals to the plurality of first memory circuits so that the second refresh control signals are sent at different times.

2. The apparatus of claim 1, wherein the interface circuit is operable to receive the first refresh control signal from a memory controller of the system.

3. The apparatus of claim 1, wherein the interface circuit is operable to apply a delay to at least one second refresh control signal based on a minimum time required to elapse between transmission of each of the second refresh control signals, the minimum time being associated with the simulation of the at least one second memory circuit such that the minimum time is increased as a result of the simulation.

4. The apparatus of claim 3, wherein the interface circuit is operable to apply the delay to the at least one second refresh control signal based on the minimum time associated with the simulation of the at least one second memory circuit for reducing peak current draw.

5. The apparatus of claim 1, wherein the interface circuit is operable to stagger the transmission of the second refresh control signals.

6. The apparatus of claim 1, wherein each second refresh control signal is a copy of the first refresh control signal.

7. The apparatus of claim 1, wherein the interface circuit is operable to transmit each second refresh control signal to a different subset of the first memory circuits.

8. The apparatus of claim 7, wherein the interface circuit is operable to transmit a single second refresh control signal to two or more first memory circuits.

9. The apparatus of claim 1, wherein the one or more simulated second memory circuits appear to the system as having a column address strobe (CAS) latency that is longer than a CAS latency of each first memory circuit.

10. The apparatus of claim 1, wherein the one or more simulated second memory circuits appear to the system as having a row address to column address (tRCD) latency and a row precharge (tRP) latency that are longer than a tRCD latency and a tRP latency, respectively, of each first memory circuit.

11. A method, comprising:
receiving, from a system, a first refresh control signal sent to at least one simulated memory circuit, wherein each simulated memory circuit comprises two or more physical memory circuits appearing to the system as a single memory circuit having a memory capacity larger than a memory capacity of each physical memory circuit; and
in response to receiving the first refresh control signal, transmitting a plurality of second refresh control signals to the two or more physical memory circuits within a span of time specified by a row refresh cycle time (tRFC) associated with the at least one simulated memory circuit, the two or more physical memory circuits being positioned on a dual in-line memory module (DIMM),
wherein transmitting the plurality of second refresh control signals comprises sending the second refresh control signals at different times.

12. The method of claim 11, wherein each of the plurality of second refresh control signals is transmitted to a different one of the two or more physical memory circuits.

13. The method of claim 11, wherein at least one of the second refresh signals is transmitted to more than one of the physical memory circuits.

14. The method of claim 11, wherein transmitting the second refresh control signals comprises applying a delay to at least one of the second refresh controls signals, the delay being based on the tRFC associated with the at least one simulated memory circuit for reducing peak current draw.

15. The method of claim 11, wherein transmitting the second refresh control signals comprises applying a delay to at least one of the second refresh controls signals, the delay being based on the tRFC associated with each of the physical memory circuits.

16. The method of claim 11, wherein transmitting the plurality of second refresh control signals comprises staggering delivery of the second refresh control signals.

17. The method of claim 11, wherein each second refresh control signal is a copy of the first refresh control signal.

18. The method of claim 11, wherein each simulated memory circuit comprises a CAS latency that is longer than a CAS latency of each physical memory circuit.

19. The method of claim 11, wherein each simulated memory circuit comprises a tRCD latency and a tRP latency that are longer than a tRCD latency and a tRP latency, respectively, of each physical memory circuit.

* * * * *

UNITED STATES PATENT AND TRADEMARK OFFICE
CERTIFICATE OF CORRECTION

Page 1 of 1

PATENT NO.        : 8,773,937 B2
APPLICATION NO.   : 13/315933
DATED             : July 8, 2014
INVENTOR(S)       : Keith R. Schakel et al.

It is certified that error appears in the above-identified patent and that said Letters Patent is hereby corrected as shown below:

In the Specification

Column 1, Line 28, delete "Prrliminary" and insert --Preliminary--;

Column 1, Line 52, delete "11/553.372" and insert --11/553,372--;

Column 1, Line 66, delete "11/672,974" and insert --11/672,924--;

In the Claims

Column 20, Line 2, Claim 13, delete "refresh" and insert --refresh control--;

Column 20, Line 6, Claim 14, delete "controls" and insert --control--;

Column 20, Line 11, Claim 15, delete "controls" and insert --control--.

Signed and Sealed this
Seventh Day of October, 2014

Michelle K. Lee
*Deputy Director of the United States Patent and Trademark Office*